US008426727B2

(12) United States Patent
Pfeiffer et al.

(10) Patent No.: US 8,426,727 B2
(45) Date of Patent: Apr. 23, 2013

(54) ORGANIC PHOTOACTIVE DEVICE

(75) Inventors: Martin Pfeiffer, Dresden (DE); Christian Uhrich, Dresden (DE); Annette Petrich, Dresden (DE); Rico Schüppel, Dresden (DE); Kerstin Schulze, Dresden (DE); Karl Leo, Dresden (DE); Peter Bäuerle, Elchingen (DE); Egon Reinold, Gögglingen (DE); Eduard Brier, Heidenheim (DE)

(73) Assignees: Heliatek GmbH (DE); Universitat ULM (DE)

( * ) Notice: Subject to any disclaimer, the term of this patent is extended or adjusted under 35 U.S.C. 154(b) by 949 days.

(21) Appl. No.: 11/817,626

(22) PCT Filed: Mar. 3, 2006

(86) PCT No.: PCT/DE2006/000394
§ 371 (c)(1),
(2), (4) Date: Apr. 10, 2009

(87) PCT Pub. No.: WO2006/092134
PCT Pub. Date: Sep. 8, 2006

(65) Prior Publication Data
US 2009/0217980 A1  Sep. 3, 2009

(30) Foreign Application Priority Data
Mar. 4, 2005  (DE) .......................... 10 2005 010 978

(51) Int. Cl.
*H01L 31/00* (2006.01)
(52) U.S. Cl.
USPC .............................. 136/263; 136/244; 427/74
(58) Field of Classification Search .................. 136/263, 136/244; 427/74
See application file for complete search history.

(56) References Cited

U.S. PATENT DOCUMENTS

| | | | | |
|---|---|---|---|---|
| 3,844,843 | A | 10/1974 | Kay et al. ...................... | 136/206 |
| 3,900,945 | A | 8/1975 | Kay et al. ......................... | 438/82 |
| 4,127,738 | A | 11/1978 | Ghosh et al. .................. | 136/255 |
| 4,175,981 | A | 11/1979 | Loutfy et al. .................. | 136/255 |
| 4,175,982 | A | 11/1979 | Loutfy .......................... | 136/255 |
| 4,461,922 | A | 7/1984 | Gay et al. ....................... | 136/249 |
| 4,461,992 | A | 7/1984 | Yamaguchi et al. ........... | 323/313 |
| 5,093,698 | A | 3/1992 | Egusa ............................. | 257/40 |
| 5,454,880 | A * | 10/1995 | Sariciftci et al. .............. | 136/263 |
| 5,849,403 | A * | 12/1998 | Aoki et al. ..................... | 428/220 |
| 5,965,063 | A | 10/1999 | Agata et al. .................... | 252/500 |
| 5,986,206 | A | 11/1999 | Kambe et al. .................. | 136/263 |
| 6,198,091 | B1 | 3/2001 | Forrest et al. ............... | 250/214.1 |
| 6,198,092 | B1 | 3/2001 | Bulovic et al. ............. | 250/214.1 |
| 6,908,782 | B2 * | 6/2005 | Yan et al. ........................ | 438/85 |
| 6,972,431 | B2 * | 12/2005 | Forrest et al. ................... | 257/40 |
| 7,605,327 | B2 * | 10/2009 | Roscheisen et al. .......... | 136/263 |
| 7,675,057 | B2 | 3/2010 | Drechsel et al. ................ | 257/40 |
| 7,675,975 | B2 | 3/2010 | Chujoh et al. ........... | 375/240.16 |
| 2004/0147701 | A1 | 7/2004 | Redecker .......................... | 528/4 |
| 2005/0238909 | A1* | 10/2005 | Kim .............................. | 428/690 |

FOREIGN PATENT DOCUMENTS

| | | |
|---|---|---|
| DE | 10313232 | 3/2003 |
| DE | 102 09 789 | 9/2003 |
| DE | 10 2004 014 046 | 9/2004 |
| EP | 1 443 093 | 8/2004 |
| EP | 1370599 | 8/2007 |
| FR | 2 852 320 | 3/2003 |
| JP | 1-215069 | 8/1989 |
| JP | 04024970 | 1/1992 |
| JP | 4-129271 | 4/1992 |
| JP | 6-151928 | 5/1994 |
| JP | 07142751 | 6/1995 |
| JP | 2004-277736 | 10/2004 |
| WO | WO 00/33396 | 6/2000 |
| WO | WO 03/075364 | 9/2003 |
| WO | WO 03/077323 | 9/2003 |
| WO | WO 2004/016709 | 2/2004 |
| WO | WO 2004016709 A1 * | 2/2004 |
| WO | WO 2004/047185 | 6/2004 |
| WO | WO 2004/049458 | 6/2004 |

OTHER PUBLICATIONS

D. Gebeyehu, Solar Energy Materials & Solar Cells 79 (2003) 81-92.*
C.W. Tang, "Two-layer organic photovoltaic cell", *Appl. Phys. Lett.*, 48(2):183-185 (1986).
B. O'Regan et al., "A low-cost, high-efficiency solar cell based on dye-sensitized colloidal $TiO_2$ films", *Nature*, 353:737-740 (1991).
C.J. Brabec et al., "Plastic Solar Cells", *Advanced Functional Materials*, 11(1):15-26 (2001).
P. Peumans et al., "Small molecular weight organic thin-film photodetectors and solar cells", *Journal of Applied Physics*, 93(7)3693-3723 (2003).
N. Karl et al., "Efficient Organic Photovoltaic Cells—The Role of Excitonic Light Collection, Exciton Diffusion to Interfaces, Internal Fields for Charge Separation, and High Charge Carrier Mobilities", *Mol. Cryst. Liq.*, vol. 252, 243-258 (1994).

(Continued)

*Primary Examiner* — Mark Eashoo
*Assistant Examiner* — M. Reza Asdjodi
(74) *Attorney, Agent, or Firm* — Ostrolenk Faber LLP

(57) ABSTRACT

The invention relates to an organic photoactive device, especially an organic photovoltaic cell, with a contact and a countercontact as well as with an organic region that is electrically connected to the contact and the countercontact, wherein a photoactive region with a photoactive bulk heterojunction or a flat heterojunction between an electron-conducting organic material and a hole-conducting organic material is formed in the organic region and wherein the hole-conducting organic material and/or the electron-conducting organic material is formed from oligomers according to any one of the following types: conjugated acceptor-donor-acceptor oligomer (A-D-A' oligomer) with an acceptor unit (A) and a further acceptor unit (A') that are each connected to a donor unit (D), and conjugated donor-acceptor-donor oligomer (D-A-D' oligomer) with a donor unit (D) and a further donor unit (D') that are each connected to an acceptor unit (A).

19 Claims, 15 Drawing Sheets

OTHER PUBLICATIONS

D. Fichou et al. Chap. 4, 227 in: D. Fichou (Ed.) *Handbook of Oligo- and Polythiophenes*, Wiley-VCH, Weinheim (1999).

J. Xue, "Asymmetric tandem organic photovoltaic cells with hybrid planar-mixed molecule heterojunctions", *Appl. Phys. Lett.*, 85(23): 5757-5759 (1986).

J. Gierschner, "Solid-state optical properties of linear polyconjugated molecules: π-stack contra herringbone", *J. Chem. Phys.* 123, s. 144914-1-144914-9 (2005).

P.M. Borsenberger, "Concerning the role of dipolar disorder on charge transport in molecularly doped polymers", *J. Chem. Phys.* 95(7), 5327-5331 (1991).

Office Action for Australian Application No. 2006220122 dated Oct. 18, 2010.

EPO Summons to Attend Oral Proceedings.

Response to EPO Summons to Attend Oral Proceedings.

H. Hoppe et al., "Organic solar cells: An overview", *J. Mater. Res.*, 19(7):1924-1945.

J. Falbe et al., "Rompp Lexikon-Chemie" pp. 2230-2231 (1997.).

Y. Sasaki et al., "Electron Diffraction Investigation of Triphenylamine", *Journal of Chemical Physics*, 31(2):477-481 (1959).

H. Chae et al., "Tertiary Building Units: Synthesis, Structure, and Porosity of a Metal-Organic Dendrimer Framework (MODF-1)", *J. Am. Chem. Soc.*, 123:11482-11483 (2001).

A. Papagni et al., "Synthesis and Spectroscopic and NLO Properties of "Push-Pull" Structures Incorporating the Inductive Electron-Withdrawing Pentafluorophenyl Group", *Eur. J. Org. Chem*, 1380-1384 (2002).

English translation of Examination Report dated May 8 2012 issued in corresponding Japanese Patent Application No. 2007-557323 (6 pages).

C. Adachi et al., "Endothermic energy transfer: A mechanism for generating very efficient high-energy phosphorescent emission in organic materials", Applied Physics Letters, vol. 79, No. 13, (2001) pp. 2082-2084.

C. Adachi et al., "High-efficiency organic electrophosphorescent devices with tris (2-phenylpyridine) iridium doped into electron-transporting materials", Applied Physics Letters, vol. 77, No. 6, (2000) pp. 904-906.

M.A. Baldo et al.,"Excitonic singlet-triplet ratio in a semiconducting organic thin film", Physical Review B, vol. 60, No. 20, (1999) pp. 14422-14428.

M.A. Baldo, et al., "Very high-efficiency green organic light-emitting devices based on electrophosphorescence", Applied Physics Letters, vol. 75, No. 1 (1999) pp. 4-6.

G. Dellepiane et al. "Long-lived photoexcited states in symmetrical polydicarbazolyldiacetylene", Physical Review B, vol. 48, No. 11 (1993) pp. 7850-7856.

J. Drechsel et al., "High efficiency organic solar cells based on single or multiple PIN structures", Thin Solid Films 451-452 (2004) pp. 515-517.

J. Drechsel et al., "MIP-type organic solar cells incorporating phthalocyanine/fullerene mixed layers and doped wide-gap transport layers", Organic Electronics, vol. 5 (2004) pp. 175-186.

O. Epshtein et al., "Dispersive dynamics of photoexcitations in conjugated polymers measured by photomodulation spectroscopy", Physical Review B, vol. 63 (2001) pp. 125206-1-125206-6.

M. Hoffmann et al., "Fluorescence Investigations of Pure and Mixed Evaporated Dye Layers", Journal of Fluorescence, vol. 5, No. 2 (1995) pp. 217-223.

T. Pappenfus et al., "Synthesis and Characterization of Tricyanovinyl-Capped Oligothiophenes as Low-Band-Gap Organic Materials", Organic Letters, vol. 5, No. 9 (2003) pp. 1535-1538.

P. Peumans et al., "Very-high-efficiency double-heterostructure copper phthalocyanine/$C_{60}$ photovoltaic cells", Applied Physics Letters, vol. 79, No.1 (2001) pp. 126-128.

G. Yu et al., "Polymer Photovoltaic Cells: Enhanced Efficiencies via a Network of Internal Donor-Acceptor Heterojunctions", Science, New Series, vol. 270, No. 5243 (1995) pp. 1789-1791.

B. Maennig et al., "Organic p-i-n solar cells", Applied Physics A, vol. 79, (2004) pp. 1-14.

Wikipedia, the free encyclopedia, "Conjugated System" Retrieved from "http://en.wikipedia.org/wiki/Conjugated_system" Categories: Chemical bonding/Physical Organic Chemistry. (Jul. 25, 2012).

* cited by examiner a)

b)

BCP= Bathocuproin
(2,9-Dimethyl-4,7-Diphenyl-
1,10-phenanthroline)
C26H20N2

BPhen= Bathophenanthrolin
(4,7-Diphenyl-1,10-phenanthroline)
C24H16N2 a)

b)

ORGANIC PHOTOACTIVE DEVICE

CROSS-REFERENCE TO RELATED APPLICATIONS

The present application is a 35 U.S.C. §§371 national phase conversion of PCT/DE2006/000394, filed Mar. 3, 2006, which claims priority of German Patent Application No. 10 2005 010 978.0, filed Mar. 4, 2005, which are herein incorporated by reference. The PCT International Application was published in the German Language.

The invention relates to an organic photoactive device, especially an organic photovoltaic cell, with a contact and a countercontact as well as with an organic region that is electrically connected to the contact and the countercontact, wherein a photoactive region is formed with a photoactive heterojunction between an electron-conducting organic material and a hole-conducting organic material in the organic region.

BACKGROUND OF THE INVENTION

The research and development in the region of organic photoactive devices, formed in a known embodiment as an organic solar cell or organic photovoltaic cell, has sharply increased in the last ten years. The maximal degree of efficiency previously reported is approximately 5.7% (cf. Jiangeng Xue et al., Appl. Phys. Lett. 85 (2004) 5757). In this manner previously typical efficiencies of 10% to 20% such as are known for inorganic solar cells have not yet been able to be achieved. However, similar results should be achievable with organic solar cells as for solar cells based on inorganic materials.

The advantages of organic solar cells over inorganic solar cells reside in particular in the lower costs. The organic semiconductor materials used are very economical when manufacturing in rather large amounts. A further advantage is formed by the partially very high optical absorption coefficients of up to $2 \times 10^5$ $cm^{-1}$, which offers the possibility of manufacturing very thin but efficient solar cells with a low expense for material and energy. Since no high temperatures are required in the manufacturing process, namely, substrate temperatures of maximally only approximately 110° C., it is possible to manufacture flexible large-surface structural parts on plastic foil or plastic tissue. This opens up new regions of application that remain closed to the conventional solar cells. On account of the almost unlimited number of different organic compounds, the materials can be tailor-made for their particular task.

In an organic photoactive device light energy is converted into electrical energy. In contrast to inorganic solar cells, in the organic semiconductor material of the organic photoactive devices, the charge carrier pairs (electron-hole pair) are not freely present after the absorption of light but rather they form a quasi-particle, a so-called exciton, namely, a bound electron-hole pair on account of a less strong sheelding of the mutual attraction. In order to make the present energy useful as electrical energy, the exciton formed in this manner must be separated into free charge carriers, that is, an electron and a hole.

Since there are not sufficiently high fields for the separation of excitons in organic solar cells, the separation of excitons is completed on photoactive interfaces. The photoactive interface can be formed as an organic donor-acceptor interface (cf. C. W. Tang, Appl. Phys. Lett., 48 (2), 183-185 (1986)) or as a interface to an inner organic semiconductor (cf. B. O'Regan et al., Nature 1991, 353, 73). The free charge carriers can be transported to the contacts after the separation. The electrical energy can be used by connecting the contacts via a consumer.

An organic material is designated in the sense of the present application as "hole-conducting" if the charge carriers in the material, that are formed as a consequence of light absorption and charge separation on a heterojunction ("photo-generated charge carriers"), are transported in the form of holes. In an analogous manner an organic material is designated as "electron-conducting" if photo-generated charge carriers are transported in the material in the form of electrons. An interface region between the electron-conducting and the hole-conducting material is designated as heterojunction.

A heterojunction between the electron-conducting and the hole-conducting material is designated as a photoactive heterojunction if excitation states that are formed in the electron-conducting and/or the hole-conducting material by the absorption of light and in which charge carriers are bound and that are also called excitons are separated in the region of the heterojunction into the individual charge carriers, namely, electrodes and holes, that for their part are then transported by the electron-conducting material/the hole-conducting material to contacts where electrical energy can be extracted.

A heterojunction between the electron-conducting and the hole-conducting material is designated as a flat heterojunction if the interface between the electron-conducting and the hole-conducting material is formed as a substantially cohesive surface between the two material regions, namely, an region of the electron-conducting material and an region of the hole-conducting material (cf. C. W. Tang, Appl. Phys. Lett., 48 (2), 183-185 (1986) or N. Karl et al., Mol. Cryst. Liq. Cryst., 252, 243-258 (1994)).

A heterojunction between the electron-conducting and the hole-conducting material is a bulk heterojunction if the electron-conducting material and the hole-conducting material are mixed with one another at least partially so that the interface between the electron-conducting and the hole-conducting material comprises a plurality of interface sections distributed over the volume of the material mixture (cf., e.g., C. J. Brabec et al., Adv. Funct. Mater. 11 (1), 15 (2001)).

Ideally, materials of photoactive layers in organic photoactive devices have a high absorption coefficient in the broadest possible wavelength range, which is coordinated with the solar spectrum. The exciton generated by absorption in the semiconductor material should be able to defuse without great energy losses to the photoactive heterojunction, during which an occurring Stokes shift should be as small as possible. Long exciton diffusion lengths make it possible to maximize the thickness of the organic layers in which absorbed light contributes to the photon flow and thus to further improve the efficiency of the organic photoactive device.

Furthermore, a highest occupied energy level (HOMO) and a lowest unoccupied energy level (LUMO) of the organic acceptor material (electron-conducting material) and of the organic donor material (hole-conducting material) are preferably to be selected in such a manner that on the one hand an efficient separation of the excitons in electrons on the acceptor material and of holes on the donor material takes place, and on the other hand the free energy of the system of generated electron and hole is as large as possible. The latter results in a maximizing of the open circuit photovoltage of the device. The charge carriers should be rapidly separated from each other spatially. Good electron transport on the acceptor material and good hole transport on donor material ensure low losses and result in a good fill factor of the current-voltage characteristics of the organic photoactive device.

Organic solar cells are known in various embodiments from the state of the art:

- One contact metal has a large and the other contact metal has a small work function, so that a Schottky barrier is formed with the organic layer (cf. U.S. Pat. No. 4,127, 738).
- The photoactive layer consists of an organic semiconductor in a gel or a binder (U.S. Pat. No. 3,844,843; U.S. Pat. No. 3,900,945; U.S. Pat. No. 4,175,981 and U.S. Pat. No. 4,175,982).
- A charge carrier transport layer is formed that contains small particles with a size of 0.01 to 50 µm that assume the charge carrier transport (cf. U.S. Pat. No. 5,965,063).
- A layer of the solar cell contains two or more types of organic pigments with different spectral characteristics (cf. JP 04024970).
- A layer of the solar cell contains a pigment that produces charge carriers, and additionally a material that removes the charge carriers (cf. JP 07142751).
- Polymer-based solar cells were manufactured containing carbon particles as electron acceptors (cf. U.S. Pat. No. 5,986,206).
- A doping of mixed systems was provided to improve the transport properties in multi-layer solar cell (cf. DE 102 09 789).
- Arrangement of individual solar cells on top of each other (tandem cell) was formed (U.S. Pat. No. 4,461,992; U.S. Pat. No. 6,198,091 and U.S. Pat. No. 6,198,092). Tandem cells can be further improved by using p-i-n structures with doped transport layers with a large band gap (cf. DE 103 13 232).

The doping of organic materials is known from document U.S. Pat. No. 5,093,698. The admixture of a doping substance, namely, a substance with high electron affinity for p-doping or of a substance with low ionizing energy for n-doping elevates the equilibrium charge carrier concentration in the doped layer and increases the conductivity. In the state of the art in document U.S. Pat. No. 5,093,698 the doped layers are used as injection layers on the interface to the contacts in electroluminescent devices.

SUMMARY OF THE INVENTION

The invention has the task of creating an organic photoactive device, in particular an inorganic photovoltaic cell of the initially cited type with an improved yield.

According to an aspect of the invention an organic photoactive device is created, in particular an inorganic photovoltaic cell, with a contact and a countercontact as well as with an organic region that is electrically connected to the contact and the countercontact, wherein a photoactive region with a photoactive bulk heterojunction between an electron-conducting organic material and a hole-conducting organic material is formed in the organic region and wherein the hole-conducting organic material is formed from oligomers in accordance with one of the following types:

- conjugated acceptor-donor-acceptor oligomer (A-D-A' oligomer) with an acceptor unit (A) and a further acceptor unit (A') that are each connected to a donor unit (D), wherein the donor unit (D) is formed as an extended donor block; and
- conjugated donor-acceptor-donor oligomer (D-A-D' oligomer) with a donor unit (D) and a further donor unit (D') that are each connected to an acceptor unit (A), wherein the donor unit (D) and the further donor unit (D') are each formed as an extended donor block.

According to a further aspect of the invention an organic photoactive device is created, in particular an inorganic photovoltaic cell, with a contact and a countercontact as well as with an organic region that is electrically connected to the contact and the countercontact, wherein a photoactive region with a photoactive bulk heterojunction between an electron-conducting organic material and a hole-conducting organic material is formed in the organic region and wherein the electron-conducting organic material is formed from oligomers in accordance with one of the following types:

- conjugated acceptor-donor-acceptor oligomer (A-D-A' oligomer) with an acceptor unit (A) and a further acceptor unit (A') that are each connected to a donor unit (D), wherein the acceptor unit (A) and the further acceptor unit (A') are formed as an extended acceptor block; and
- conjugated donor-acceptor-donor oligomer (D-A-D' oligomer) with a donor unit (D) and a further donor unit (D') that are connected to an acceptor unit (A), wherein the acceptor unit (A) is formed as an extended acceptor block.

According to a further aspect of the invention an organic photoactive device is created, in particular an inorganic photovoltaic cell, with a contact and a countercontact as well as with an organic region that is electrically connected to the contact and the countercontact, wherein a photoactive region with a photoactive flat heterojunction between an electron-conducting organic material and a hole-conducting organic material is formed in the organic region and wherein the electron-conducting and/or hole-conducting organic material is/are formed from oligomers in accordance with one of the following types:

- conjugated acceptor-donor-acceptor oligomer (A-D-A' oligomer) with an acceptor unit (A) and a further acceptor unit (A') that are each connected to a donor unit (D), wherein either at least the donor unit (D) is formed as an extended donor block or at least the acceptor unit (A) and the further acceptor unit (A') are formed as an extended acceptor block; and
- conjugated donor-acceptor-donor oligomer (D-A-D' oligomer) with a donor unit (D) and a further donor unit (D') that are connected to an acceptor unit (A), wherein either at least the acceptor unit (A) acceptor unit (A) is formed as an extended acceptor block or the donor unit (D) and the further donor unit (D') are formed as an extended donor block.

Many advantages result over the state of the art on account of the using, in accordance with the aspects of the invention, of the conjugated acceptor-donor-acceptor oligomers (A-D-A' oligomers) and of the conjugated donor-acceptor-donor oligomers (D-A-D' oligomers), that will be explained in detail in the following.

When using the A-D-A'/D-A-D' oligomers with extended donor block as hole-conducting component in a photoactive heterojunction, whether it is a flat heterojunction or a bulk heterojunction, for an electron-conducting material, holes are generated on the oligomer by the exciton separation at the heterojunction that are delocalized inside the donor block/donor blocks. Due to the delocalization, the electrostatic interaction with the electron located after the separation on the electron-conducting material drops, so that the two charge carriers can be separated efficiently and with low electrical fields already. As a result of the delocalization of the holes they have a high mobility and can be removed rapidly, efficiently and with low recombination losses. This is especially advantageous in the case of bulk heterojunctions in which both charge carriers coexist in a mixed volume consisting of a hole-conducting and electron-conducting component and, as long as they have not left the volume, are in danger of recombining.

In an analogous manner the A-D-A'/D-A-D' oligomers, that comprise an extended acceptor block, are used as electron-conducting component in a photoactive heterojunction for a hole-conducting material. The advantages for the separation of excitons and the transport of electrons result analogously from the delocalization of the electrons on the acceptor block/the acceptor blocks.

When using the A-D-A'/D-A-D' oligomers as electron-conducting and/or as hole-conducting component in a flat heterojunction it was surprisingly found that even oligomers without extended acceptor block can be advantageously used in combination with a suitable hole conductor as electron conductors even though the electrons produced in the separation of excitons are not delocalized here on the oligomer. Such a usage in bulk heterojunctions results in very low efficiencies on account of the low electron mobility and consequently high recombination losses. In flat heterojunctions all advantages of the suggested material class have full effect with the exception of a heightened mobility of the photogenerated charge carriers. The problem of the low charge carrier mobility is overcome in that when a flat heterojunction is used there is no volume in which electrons and holes coexist and therefore no recombination can take place any longer once the excitons have been separated.

Oligomers are distinguished in contrast to polymeric compounds in that they comprise a well-defined number of monomers (repeated units) that is typically between three and ten. Thus, oligomers form molecules with a defined number of monomers. They therefore also have a well-defined molar mass, typically less than 1200 g/mol, and are free of undefined, possibly reactive groups at the end of the molecular chain, as can be present as a byproduct of a polymerization chain reaction in polymers.

Furthermore, technological advantages of oligomers are the ability to vaporize in a vacuum and the associated possibility of purification by gradient sublimation. This results for oligomers that can be deposited by vapor deposition in the possibility of producing multilayer systems that are almost as complex as desired by sequentially vapor-depositing different pure or mixed materials. Mixed layers with controlled composition are produced by simultaneously vaporizing different materials from different vaporizer sources onto a substrate, during which the vapor deposition rates can be separately controlled, e.g., by oscillation quartz monitors.

In this manner, even controlled p-doped and n-doped layers and photoactive donor-acceptor mixed layers can be produced. Then, the morphology of the mixed layers can be varied over a large range by selecting the substrate temperature during the vapor-depositing. On cold substrates a homogenous, largely amorphous mixture is typically produced whereas at higher substrate temperatures a nanophase separation and possibly a formation of crystalline nanodomains increasingly occur. Thus, the control over the phase separation on a size scale of 10 to 100 nm successfully takes place, which is especially advantageous for so-called photoactive bulk heterojunctions. For polymers applied by spin-coating mixed solutions, a strong phase separation frequently occurs, especially if one of the components has too low a solubility.

Much higher photovoltaic degrees of efficiency in comparison to all known solar cells based on conjugated oligomers have been achieved with the aid of using the A-D-A' oligomers and the D-A-D' oligomers in accordance with the various aspects of the invention. Comparable degrees of efficiency were previously achieved only with polythiophene and with large condensed molecules such as phthalocyanine or perylene derivatives, which, however, do not have an oligomeric character. The reason for this breakthrough is viewed in a combination of the unique properties of the material class used and of a targeted use of these materials in organic photoactive devices in such a manner that the material properties are optimally utilized.

The A-D-A' oligomers and D-A-D' oligomers are distinguished in comparison to customary oligomers by an intramolecular donor-acceptor effect in solution already, which results in an optical absorption spectrum strongly shifted towards longer wavelengths. This overcomes the problem of conventional oligomers for photovoltaics, that they have a higher optical band gap than analogous polymers.

When building thin films of the A-D-A'/D-A-D' oligomers the absorption spectrum widens and shifts further to longer wavelengths, as a result of which the spectral overlap with the solar spectrum is further improved. In contrast thereto, in the case of conventional oligomers in thin films a shift of the absorption maximum toward shorter wavelengths is frequently observed (cf. e.g., data for quinquethiophene in D. Fichou and C. Ziegler, chap. 4, p. 227 in: D. Fichou (ed.) Handbook of Oligo- and Polythiophenes, Wiley-VCH, Weinheim, 1999, or table 1 in: J. Gierschner et al., J. Chem. Phys. 123, p. 144914 (2005)).

The A-D-A'/D-A-D' oligomers have an intensive fluorescence that is shifted only slightly toward longer wavelengths relative to the absorption maximum since the optically allowed transition is at the same time the excitation state with the lowest energy, so that little energy is lost by relaxation within the exciton band. The ratio of optical band gap and maximally achievable photovoltage is therefore more favorable than for customary oligomers, in which a very inefficient fluorescence that is strongly shifted toward longer wavelengths frequently occurs in thin layers, which can be traced back to high energy losses due to relaxation processes in the exciton band directly after the optical excitation and/or formation of excimers (cf. J. Gierschner et al., J. Chem. Phys. 123, p. 144914 (2005)).

The energies of a lowest unoccupied molecular orbital (LUMO) and/or of a highest occupied molecular orbital (HOMO) of customary donor/acceptor oligomers can be optimized energetically for the requirements in organic photoactive devices by insertion into the A-D-A'/D-A-D' oligomers. For example, the insertion of conventional donor oligomers into the A-D-A'/D-A-D' oligomers can result in a lowering of the HOMO and in an even more sharply pronounced lowering of the LUMO in comparison to the corresponding conventional donor oligomer, which simultaneously results in the reduction of the optical band gap and in an elevation of the photovoltage when the A-D-A'/D-A-D' oligomer is used as a hole conductor in a photoactive heterojunction with a given electronic conductor, e.g., Fulleren C60.

In comparison to simple donor-acceptor oligomers (D-A oligomer) the A-D-A'/D-A-D' oligomers have a lesser or imperceptible dipole moment, which lowers the dipolar disorder in amorphous or polycrystalline solid bodies, e.g., thin layers. Bipolar disorder is to be avoided since it drastically lowers the charge carrier mobility (cf. P. M. Borsenberger et al., J. Chem. Phys., 95 (7), 5327-5331 (1991).)

Furthermore, the A-D-A'/D-A-D' oligomers have the advantage that they comprise at least one extended donor block or one extended acceptor block. A desired delocalization of the excitons formed by light absorption is achieved with the aid of the extended blocks so that the subsequent charge carrier separation is optimized. On the other hand, alternating D-A molecules with a monomer sequence D-A-D-A-D . . . have the problem that the on-chain bandwidth decreases, since e.g., the HOMO wave function concentrates on the donor building blocks and the interaction among the HOMO orbitals, that results in band splitting, decreases when acceptor components are located between them that do not offer any level that is in resonance with the donor HOMOs. As a result, the effective conjugation length decreases and even the smallest disturbances have the consequence that charge carriers are largely localized on a single monomer, which for its part has a disadvantageous effect on exciton separation and charge carrier transport.

Designations used in the present application are explained in more detail in the following for a further understanding of the invention.

A conjugated A-D-A' oligomer with extended donor block/acceptor block is designated here for the sake of simplification also as A-D-A' BCO ("acceptor-donor-acceptor block co-oligomer"). Analogously, a conjugated D-A-D' oligomer with extended donor-/acceptor block is also designated as D-A-D' BCO ("donor-acceptor-donor block co-oligomer"). It is necessary here that at least one extended donor block or two extended acceptor blocks occur in the A-D-A' BCO and one extended acceptor block or two extended donor blocks occur in the D-A-D' BCO.

A unit in the sense of the present invention is a group of atoms within a chemical compound that comprises at least one monomer. A monomer in the sense of the present application is a group of atoms within a chemical compound that comprises at least one subgroup of atoms with a conjugated $\pi$ electron system and that fulfils the condition that the group of atoms is not built up from several similar units connected only by a bond.

A unit forms an acceptor unit relative to a donor unit if a lowest unoccupied molecular orbital (LUMO) of the acceptor unit is at least 0.2 eV, preferably at least 0.3 eV energetically lower than a lowest unoccupied molecular orbital (LUMO) of the donor unit. For further optimization of the acceptor action an advantageous embodiment can provide that a highest occupied molecular orbital (HOMO) of the acceptor unit is at least 0.1 eV, preferably at least 0.2 eV energetically lower than a highest occupied molecular orbital (HOMO) of the donor unit.

It is analogously true that a unit forms a donor unit relative to an acceptor unit if a highest occupied molecular orbital (HOMO) of the donor unit is at least 0.2 eV, preferably at least 0.3 eV energetically higher than a highest occupied molecular orbital (HOMO) of the acceptor unit. For further optimization of the acceptor action an advantageous embodiment can provide that a lowest unoccupied molecular orbital (LUMO) of the donor unit is at least 0.1 eV, preferably at least 0.2 eV energetically higher than a lowest unoccupied molecular orbital (LUMO) of the acceptor unit.

If at least one of the participating units comprises several monomers, a unit forms an acceptor unit with i (i≧1) monomers $A_i$ relative to a donor unit with j (j≧1) monomers $D_j$ if in the acceptor unit a lowest unoccupied molecular orbital (LUMO) is at least 0.2 eV, preferably at least 0.3 eV energetically lower, at least for a monomer adjacent to the donor unit, than a lowest unoccupied molecular orbital (LUMO) of an associated neighbor monomer in the donor unit that forms in the donor unit the neighbor to the adjacent monomer in the acceptor unit. In a preferred further development the cited energetic relations apply for all monomers of the acceptor unit relative to all monomers of the donor unit. The previous comments for the further optimization of the acceptor action apply in a corresponding manner. It can also be provided that the acceptor unit comprises several monomers and the donor unit only one monomer and vice versa.

If at least one of the participating units comprises several monomers, a unit forms an acceptor unit with i (i≧1) monomers $A_i$ relative to a donor unit with j (j≧1) monomers $D_j$ even then if the following condition, that can be rechecked experimentally, e.g., by electrochemical measurements in solution and/or by combinations of photoelectron spectroscopy on the solid body, has been fulfilled: The affixing of the acceptor unit to one or both sides of the donor unit results in a lowering of a lowest unoccupied molecular orbital (LUMO) of the molecule formed in this manner by at least 0.2 eV, preferably by at least 0.3 eV relative to a lowest unoccupied molecular orbital (LUMO) of the donor unit, whereas a highest occupied molecular orbital (HOMO) of the molecule formed in this manner energetically remains the same, is lowered or is raised by a maximum of 0.1 eV.

A unit in the sense of the present invention is also a donor unit with i (i≧1) monomers $D_i$ relative to an acceptor unit with j (j≧1) monomers $A_j$ if in the donor unit a highest occupied molecular orbital (HOMO) is at least 0.2 eV, preferably at least 0.3 eV energetically higher, at least for a monomer adjacent to the acceptor unit, than a highest occupied molecular orbital (HOMO) of an associated neighbor monomer in the acceptor unit that forms in the acceptor unit the neighbor to the adjacent monomer in the donor unit. In the preferred case the cited energetic relations apply for all monomers of the donor unit relative to all monomers of the acceptor unit. The above comments for the further optimization of the donor action apply in a corresponding manner.

A unit in the sense of the present invention is also a donor unit with i (i≧1) monomers $D_i$ relative to an acceptor unit with j (j≧1) monomers $A_j$ if the following condition, that can be rechecked experimentally, e.g., by electrochemical measurements in solution and/or by combinations of photoelectron spectroscopy on the solid body, has been fulfilled: The affixing of the donor unit to one or both sides of the acceptor unit results in a raising of a highest occupied molecular orbital (HOMO) of the molecule formed in this manner by at least 0.2 eV, preferably by at least 0.3 eV relative to a highest occupied molecular orbital (HOMO) of the acceptor unit, whereas a lowest unoccupied molecular orbital (LUMO) of the molecule formed in this manner energetically remains the same, is raised or is lowered by a maximum of 0.1 eV.

An acceptor unit is an extended acceptor block if the acceptor unit (i) comprises at least two monomers, preferably at least three monomers and/or if the acceptor unit (ii) comprises at least eight, preferably at least ten atoms with a common conjugated $\pi$ electron system formed by atoms of one or several chemical elements from the following group of elements: C, N, B, P, S, Si and O. The latter can also be fulfilled especially if the acceptor unit comprises only one monomer. In an analogous manner an extended donor block is determined on the basis of a donor unit. A desired delocalization of the excitons formed by light absorption is supported with the aid of the extended blocks so that the subsequent charge carrier separation is optimized.

An extended acceptor block is distinguished in a preferred further development of the invention in that the extended acceptor block comprises at least one extended acceptor sub-block that for its part is an extended block in the above sense and in which the lowest unoccupied molecular orbital (LUMO) of all monomers participating in the acceptor sub-block are in an energetic interval with a width of maximally approximately 0.5 eV, preferably maximally approximately 0.3 eV, so that a wave function for electrons has the largest possible uniform coefficients on the participating monomers of the extended acceptor subblock. It is analogously true that an extended donor block in a preferred further development of the invention contains at least one extended donor subblock that for its part is an extended block in the above sense and in which the highest occupied molecular orbital (HOMO) of all monomers participating in the extended donor subblock are in an energetic interval with a width of maximally approximately 0.5 eV, preferably maximally approximately 0.3 eV, so that a wave function for holes has the largest possible uniform coefficients on the participating monomers of the extended donor subblock.

The charge separation after the light absorption preferably takes place in such a manner that the charge carrier sort (electrons; holes) formed here on the oligomer inside the extended block is delocalized, which improves the charge separation as well as the subsequent charge carrier transport. Furthermore, the delocalization of charge carriers reduces the local spin density of charged molecules, which generally reduces the reactivity of the radical species and thus raises its electrochemical stability.

A purposeful further development of the invention provides that in the conjugated acceptor-donor-acceptor oligomer (A-D-A' oligomer) the acceptor unit (A) and the further acceptor unit (A') are formed from monomers of the same type. Such a buildup of the oligomers has the advantage that an energetic disorder occurs when a molecule is inserted in the solid body in an irregular manner, e.g., in a mirror-inverted manner, remains small and thus relatively high charge carrier mobilities can be achieved even in disorder. This applies in an analogous manner to conjugated donor-acceptor-donor oligomers (D-A-D' oligomer), for which the donor unit (D) and the further donor unit (D') are formed from monomers of the same type.

An advantageous embodiment of the invention provides that in the conjugated acceptor-donor-acceptor oligomer (A-D-A' oligomer) the donor unit (D) has a monomer sequence of the type $D_1 D_2 \ldots D_{m-1} D_m$ (m>2), and that a highest occupied molecular orbital (HOMO) of the monomers $D_1$ and $D_m$ is at least 0.2 eV energetically higher than a highest occupied molecular orbital (HOMO) of the other monomers $D_2 \ldots D_{m-1}$. This at least partially compensates the electron-attracting action of the acceptor units on the donor monomers on the edge of the donor block in that monomers are used here that are especially electron-rich in isolated form, e.g., EDOT monomers, if the other monomers are thiophene rings. As a consequence, a concentration of photogenerated holes on monomers that are not in the immediate vicinity of the acceptor groups is counteracted and the hole wave function can be distributed optimally and uniformly onto the entire donor block.

In an analogous manner it can be purposefully provided that in the conjugated donor-acceptor-donor oligomer (D-A-D' oligomer) the acceptor unit (A) comprises a monomer sequence of the type $A_1 A_2 \ldots A_{m-1} A_m$ (m>2), wherein a lowest unoccupied molecular orbital (LUMO) of monomers $A_1$ and $A_m$ is at least 0.2 eV energetically lower than a lowest unoccupied molecular orbital (LUMO) of the other monomers $A_2 \ldots A_{m-1}$.

A preferred further development provides that a mirror symmetry or point symmetry is formed in the conjugated acceptor-donor-acceptor oligomer (A-D-A' oligomer). It can also be provided in a purposeful further development of the invention that a mirror symmetry or point symmetry is formed in the conjugated donor-acceptor-donor oligomer (D-A-D' oligomer). The advantage of a mirror symmetry or point symmetry is that the static dipole moment of the oligomers is minimized and in this manner dipolar disorder that reduces the charge carrier mobility is avoided. In any case, high symmetries bring it about that highly ordered layers can be formed more readily since certain types of point defects (reflected molecules) are excluded from the start.

A purposeful further development of the invention provides that the contact and/or the countercontact is/are designed as a transparent or semi-transparent electrode.

A preferred further development of the invention can provide that at least one inorganic layer of one or more inorganic materials is formed between the contact and the countercontact.

An advantageous embodiment of the invention provides that the conjugated acceptor-donor-acceptor oligomer (A-D-A' oligomer) and/or the donor-acceptor-donor oligomer (D-A-D' oligomer) is/are formed as an oligomer that comprises nitrile groups on at least one acceptor unit (A; A') and in which at least one donor unit (D; D') comprises peripheral hydrogen atoms such as, e.g., in thiophene derivatives. An attracting intramolecular nitrile-hydrogen interaction occurs here between the acceptor units of a molecule with the donor unit of the neighboring molecules so that an advantageous arrangement of the molecules among each other is supported with a strong offset in the stacks. The formation of such nitrile-hydrogen bridges can be spectroscopically demonstrated since it results in a characteristic shifting of the oscillation modes in which the hydrogen atom participates.

It can be provided in a purposeful manner that the contact is an anode and that a p-doped organic layer is arranged between the anode and the photoactive heterojunction (M-i-p diode).

A preferred further development provides that the countercontact is a cathode and that an n-doped organic layer is arranged between the cathode and the photoactive heterojunction (M-i-n or n-i-p diode).

A purposeful further development of the invention can provide that the organic region is deposited at least partially by thermal vaporizing in a high vacuum or by vaporizing of organic materials into an inert carrier gas that transports the vaporized organic materials to a substrate ("organic vapor phase deposition").

An advantageous embodiment of the invention provides that the organic region is deposited at least partially from one or several liquid solutions by spin-coating, application with a doctor blade and/or printing.

A preferred further development of the invention can provide that the donor unit (D) and/or the further donor unit (D') contains/contain at least one of the following donor-like monomers with or without additional peripheral substituents: thiophene; thienopyrazine; benzothiadiazole; ethylene dioxothiophene (EDOT) or ethylene dithiothiophene; isothianaphthene (ITN); bridged dithiophene unit; 1,3 thiazole; 1,3,4-thiadiazole; thieno-thiadiazole; thieno-selenodiazole; phenyl; naphthyl; anthrazene; tetrazene; pentazene; vinylene; phenylene vinylene; pyridines; pyrimidines; porphrine; phthalocyanines; fluorene; carbazole; perylene; pyrene and di- or triarylamine.

A purposeful further development of the invention can provide that the acceptor unit (A) and/or the further acceptor unit (A') contains/contain at least one of the following acceptor-like monomers with or without additional peripheral substituents: cyano vinylene, bicyano vinylene or tricyano vinylene; bridged dithiophene unit with electron-attracting bridge; benzothiadiazole; oxadiazole; triazole; benzimidazole; quinolines; quinoxalines; pyrazolines; naphthanene dicarboxylic acid anhydrides; naphthalene dicarboxylic acid imides; naphthalene dicarboxylic acid imidazoles; halogenated homocycles and heterocycles; di- or triarylboryl; dioxaborine derivatives; quinoid structures and aryls with ketone- or dicyanomethane substituents.

Furthermore, a device with a stacked arrangement of several organic photoactive devices, especially organic photovoltaic cells, can be provided in one of the previously cited embodiments.

BRIEF DESCRIPTION OF THE DRAWINGS

The invention is explained in detail in the following using exemplary embodiments and referring to figures of the drawings, in which.

DESCRIPTION OF PREFERRED EMBODIMENTS

The A-D-A'-BCO/D-A-D'-BCO (conjugated acceptor-donor-acceptor oligomers (A-D-A' oligomers)/conjugated donor-acceptor-donor oligomers (D-A-D' oligomers)) are used as light-absorbing, electron-conducting material (ETM—"electron transport material") or light-absorbing, hole-conducting material (HTM—"hole transport material") in photoactive organic devices with a photoactive heterojunction in various embodiments. Here, the hole-conducting material (HTM) forms the donor of the heterojunction and the electron-conducting material (ETM) forms the acceptor of the heterojunction.

Figure 1:
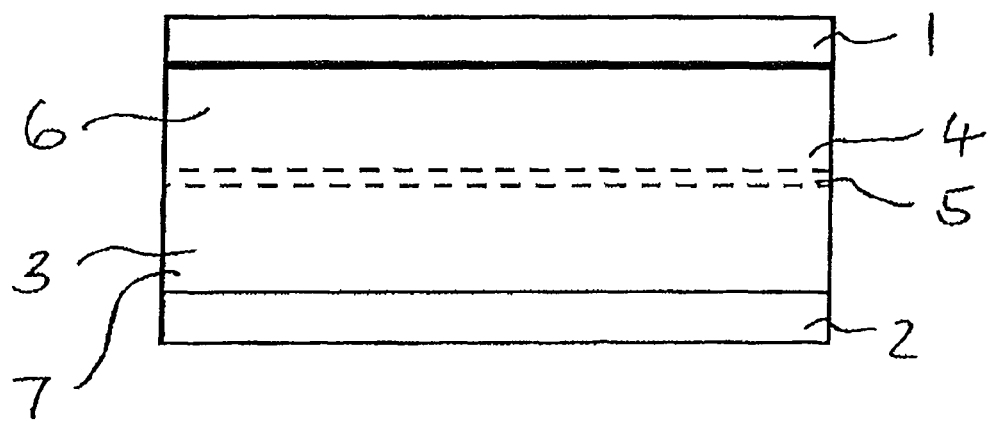
FIG. 1 shows a schematic representation of a photoactive organic device.

FIG. 1 shows a schematic representation of a photoactive organic device with a contact 1 and a countercontact 2 as well as with an organic region 3 electrically connected to contact 1 and countercontact 2, in which a photoactive region 4 with a photoactive heterojunction 5 is formed between an electron-conducting organic material 6 and a hole-conducting organic material 7 in organic region 3.

If the A-D-A'-BCO is used as hole-conducting material (HTM), the associated electron-conducting material (ETM), e.g., Fulleren $C_{60}$, is selected in such a manner that after light excitation of the A-D-A'-BCO a rapid electron transfer to the electron-conducting material (ETM) takes place. If the A-D-A'-BCO is inversely used as electron-conducting material (ETM), the complementary hole-material (HTM) is selected in such a manner that after light excitation of the A-D-A'-BCO a rapid hole transfer onto the hole-conducting material (HTM) takes place.

The heterojunction 5 between the electron-conducting material 6 and the hole-conducting material 7 is designed as a flat heterojunction when the interface between the electron-conducting and the hole-conducting material 6, 7 is formed as a substantially cohesive surface between the two material regions, namely, a region of the electron-conducting material 6 and a region of the hole-conducting material 7.

The heterojunction 5 between the electron-conducting and the hole-conducting material 6, 7 is a bulk heterojunction if the electron-conducting material 6 and the hole-conducting material 7 are mixed at least partially with one another so that the interface between the electron-conducting and the hole-conducting material 6, 7 comprises a plurality of interface sections distributed over the bulk of the material mixture.

The photoactive region 4 with the photoactive heterojunction 5 between an A-D-A'-BCO and an acceptor material (electron-conducting material) can be constructed as an M-i-M-, p-i-n-, M-i-p- or M-i-n-structure (M=metal, p=p-doped organic or inorganic semiconductor, n=n-doped organic or inorganic semiconductor, i=intrinsically conductive system of organic layers).

An embodiment of tandem cells that are known as such (cf. P. Peumans et al., J. Appl. Phys., 93 (7), 3693-3723 (2003);

U.S. Pat. No. 4,461,922; U.S. Pat. No. 6,198,091; U.S. Pat. No. 6,198,092) can be provided. Tandem cells of two or more stacked M-i-M-, p-i-n-, M-i-p- or M-i-n diodes are also possible (cf. DE 103 13 232).

The photoactive device is produced in the various embodiments in that the layers are deposited by thermal vapor deposition in a high vacuum system with a base pressure of $10^{-6}$ to $10^{-8}$ bar. Organic materials are vapor-deposited from ceramic sources heated by resistor wires. Metal contacts are vapor-deposited from molybdenum boats or ceramic boats heated directly by a current flow through the boat, during which the vapor-deposition rate is measured and controlled by oscillating quartz monitors. Mixed layers are produced by simultaneously vapor-depositing a substrate from several separately heated sources controlled by different oscillating quartz monitors. The organic materials used were previously purified by sublimation under a high vacuum in an oven with a temperature gradient.

Figure 5:
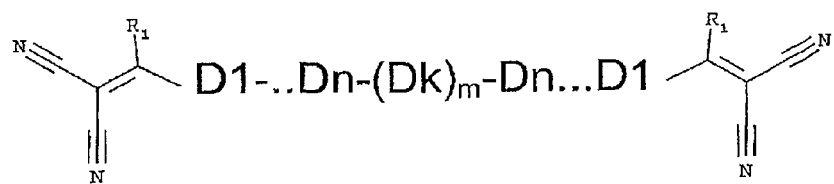
FIG. 5 shows a general structural sequence for conjugated A-D-A oligomers with extended donor block with mirror symmetry/point symmetry and dicyanovinylene as acceptor group.

A simple representative of the group of A-D-A'-BCO is DCV3T. FIG. 5 shows examples for the chemical structure of bis(dicyanovinylene) oligothiophene derivatives, in which $n \geq 1$ and R1-R4=any groups, preferably hydrogen, halogen, nitrile, alkyl group, alkoxy group or aryl group:
DCV3T: R1, R2 and R3=hydrogen, R4=butyl and n=1;
DCV5T: R1, R2 and R3=hydrogen, R4=butyl and n=2;
DCV7T: R1, R2 and R3=hydrogen, R4=butyl and n=3;
TCV3T: R1=nitrile, R2 and R3=hydrogen, R4=butyl and n=1;

Alkyl groups are, e.g., methyl, ethyl, propyl, butyl, pentyl, hexyl or the like, that can also be branched, e.g., as tertiary butyl. Aryl groups are, e.g., phenyl, naphthyl or also heterocycles with nitrogen of sulfur or oxygen in the ring. The peripheral hydrogen atoms on alkyl groups, alkoxy groups and aryl groups can be replaced entirely or partially by halogen atoms or nitrile groups.

Figure 3:
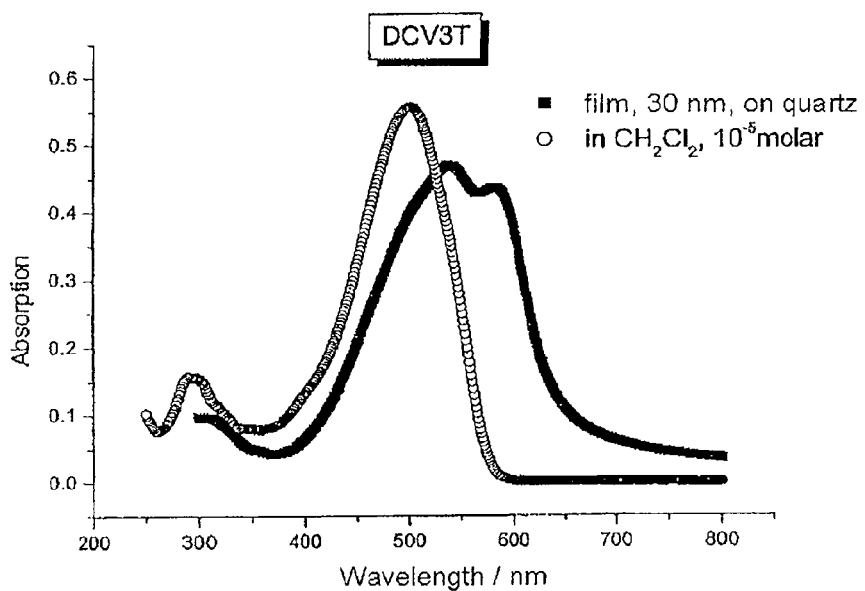
FIG. 3 shows an absorption spectrum of DCV3T in solution (circles) and in a 30 mm-thick vapor-deposition layer on quartz glass (rectangles)

The absorption spectrum of DCV3T in thin layers shows, in comparison to the spectrum of dissolved molecules, the desired red shift (cf. FIG. 3). This concerns a conjugated A-D-A' oligomer, which is manifested in a comparison with terthiophene (3T) without DCV end groups. Since the electrochemical reduction of 3T cannot be measured, the A-D-A' character is shown here most clearly in the extreme red shift of the absorption of 3T to DCV3T with simultaneous elevation of the first oxidation potential (cf. table 1).

FIG. 3 shows an absorption spectrum of DCV3T in solution (circles) and in a 30 nm-thick vapor-deposition layer on quartz glass (rectangles). The spectrum is clearly shifted in the layer to longer wavelengths (red shift). The pronounced structure of the spectrum in the layer is an indication of a planarization of the monomer rings in the oligomer, which is advantageous for high charge carrier mobilities, since it favors the overlap of the molecules adjacent to the π orbital.

TABLE 1

| | Terthiophene (3T) | DCV3T |
|---|---|---|
| First absorption peak in $CH_2Cl_2$ (wavelength in nm and energy in eV) | 336 nm; 3.69 eV | 500 nm; 2.48 eV |
| First reduction peak in $CH_2Cl_2$ (vs. $Fc/Fc^+$) | Not observable in $CH_2Cl_2$ i.e. <1.7 V) | −1.32 V |
| First oxidation peak in $CH_2Cl_2$ (vs. $Fc/Fc^+$) | ~+0.7 V (converted from +1.1 V vs. Ag/AgCl | +0.98 V |

Figure 4:
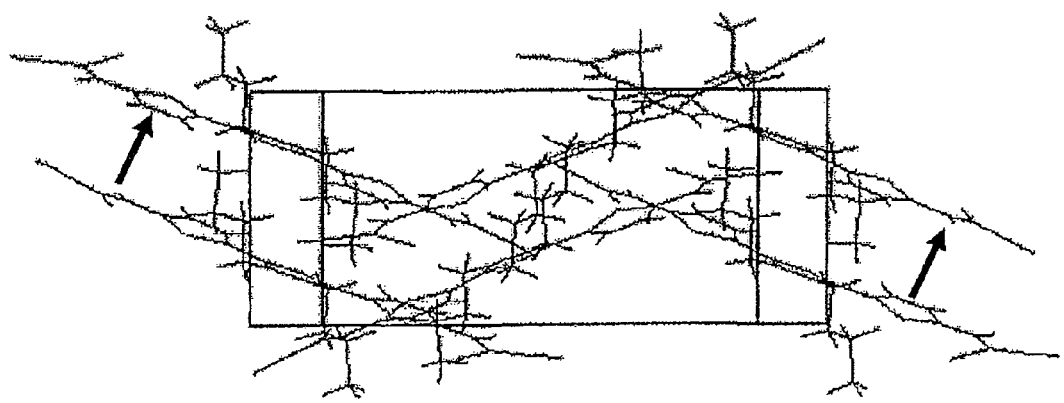
FIG. 4 shows a crystalline structure of DCV3T determined from X-ray diffraction experiments.

FIG. 4 shows a crystalline structure of DCV3T. The strong offset of the oligomers in the stack favors an attracting interaction between the transitional dipole moments during excitation in phase and therewith a red shift of the permitted optical transitions in comparison to the absorption of the solution. The interaction between the dicyanovinyl acceptor units with the thiophene rings of the nearest neighbors is indicated by arrows.

FIG. 5 shows a general structure sequence for conjugated A-D-A oligomers with extended donor block with mirror symmetry or point symmetry and dicyanovinylene as acceptor group in which $R1=n \geq 1$ and R1-R4=any groups, preferably hydrogen, halogen, nitrile, alkyl, alkoxy or aryl group. For example, the monomers shown in FIG. 6 can be used in any sequence in the donor block as donor monomers.

Figure 6:
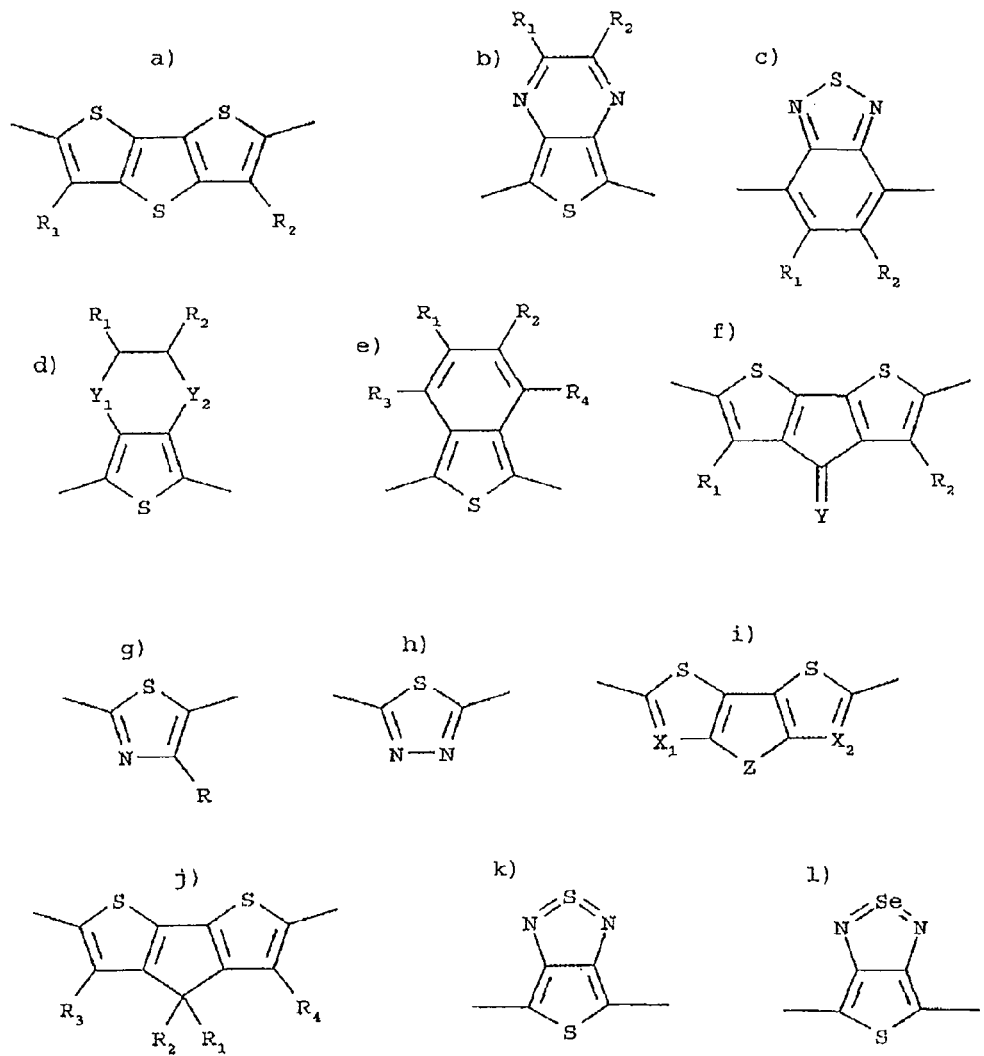
FIG. 6 shows examples for donor units in conjugated A-D-A'/D-A-D' oligomers.

FIG. 6 shows further examples for donor monomers that can be used in A-D-A'-BCO or D-A-D'-BCO, in which X and Y=CR1 or N, Z=S, CO, CR1R2, NR1, and in which R1 respectively R2=any group, preferably hydrogen, a halogen, nitrile, alkyl, alkoxy or aryl group. The units c) and f) carry only conditionally a donor character and can occur in combination with stronger donor units even with acceptor function in A-D-A'/D-A-D' oligomers. In addition to the donor groups shown, even vinyl phenyl, naphthyl, anthrazene or other homoycles or heterocycles can be used. The connection to the adjacent monomer in the oligomer preferably takes place in accordance with the bonds sketched in dashed lines but can also be made at any other location that carries a peripheral hydrogen or a group R. If a bond sketched in dotted lines here is not used to bond to an adjacent molecule, any group R can occur here again.

Figure 7:
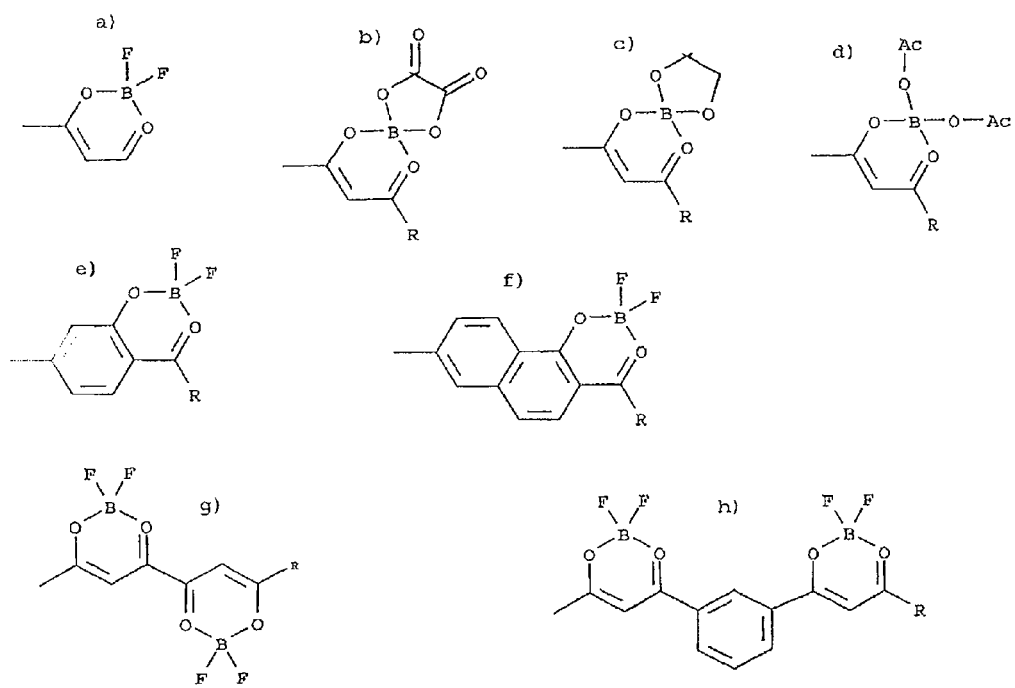
FIG. 7 shows examples for acceptor units based on the dioxaborine group.

FIG. 7 shows examples for acceptor-like units based on the dioxaborine group, that can be used in A-D-A'-BCO or D-A-D'-BCO. In the A-D-A'-BCOs according to FIG. 5 the latter can replace, e.g., the dicyanovinylene end groups. R is any group, preferably, however, a hydrogen, halogen, nitrile, alkyl, alkoxy or aryl group. All other peripheral hydrogen atoms can also be substituted by any R group. The connection to the adjacent monomer in the oligomer preferably takes place according to the bonds sketched in dashed lines; however, it can also be made at any other location carrying a peripheral hydrogen or a group R. If a bond sketched in dashed lines here is not used to bond to a neighbor molecule, any group R can occur here again.

The absorption edge of A-D-A'-BCO can be adjusted by the selection of the donor blocks. A red shift of the absorption occurs, e.g., if donor monomers with a lower-lying LUMO are inserted into the donor block as in embodiments b) c) and f) in FIG. 6.

Figure 8:
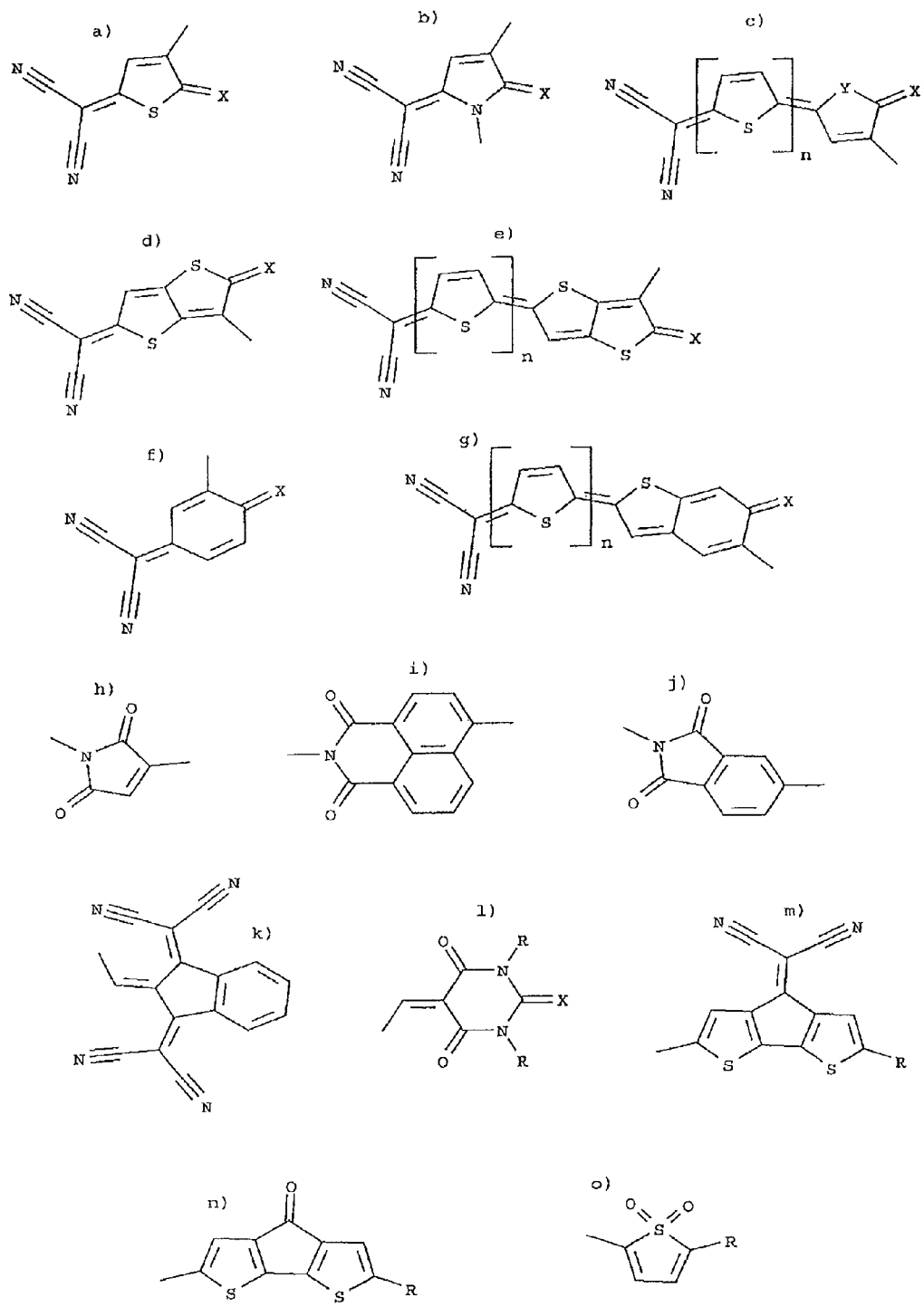
FIG. 8 shows examples for acceptor units that can be used in conjugated A-D-A' oligomers.

FIG. 8 shows further examples for acceptor groups that can be used in A-D-A'-BCO. X designates an oxygen or sulfur atom, Y designates S or NR, R designates any group, preferably, however, hydrogen, halogen, nitrile, alkyl, alkoxy or aryl groups. The oligothiophene units in molecules c, e and g in FIG. 8 have acceptor character due to the quinoid structure. The connection to the adjacent monomer in the oligomer preferably takes place in accordance with the bonds sketched in dashed lines but can also take place at any other location that carries a peripheral hydrogen or an R group. If a bond sketched in dashed lines here is not used to bond to an adjacent molecule, any R group can occur here again.

Figure 9:
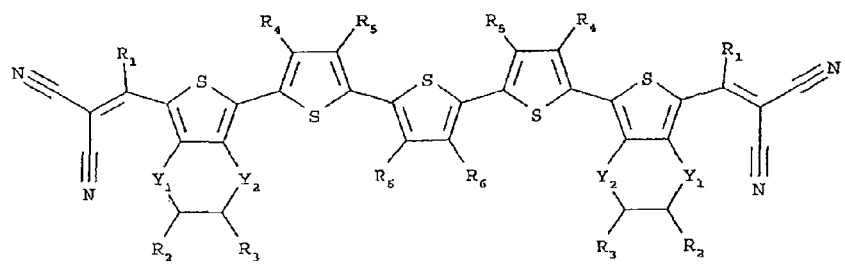
FIG. 9 shows conjugated A-D-A' oligomers in which strong donor units are arranged on both ends of the extended donor block, in which Y1 and Y2 designate oxygen atoms or sulfur atoms and R1-R6 designate any groups, preferably, however, a hydrogen atom or halogen groups, nitrile groups, alkyl groups, alkoxy groups or aryl groups.
Figure 9:
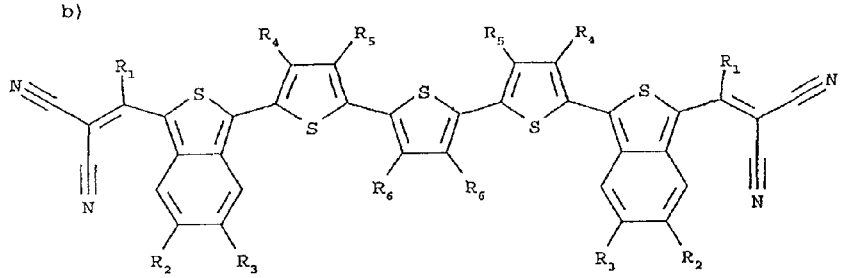

FIG. 9 shows examples for conjugated A-D-A oligomers in which especially strong donor unit are inserted at both ends of the extended donor block. Here, Y1 and Y2 designate oxygen atoms or sulfur atoms. R1-R6 are any groups, but preferably hydrogen or halogen, nitrile, alkyl, alkoxy or aryl groups.

Figure 10:
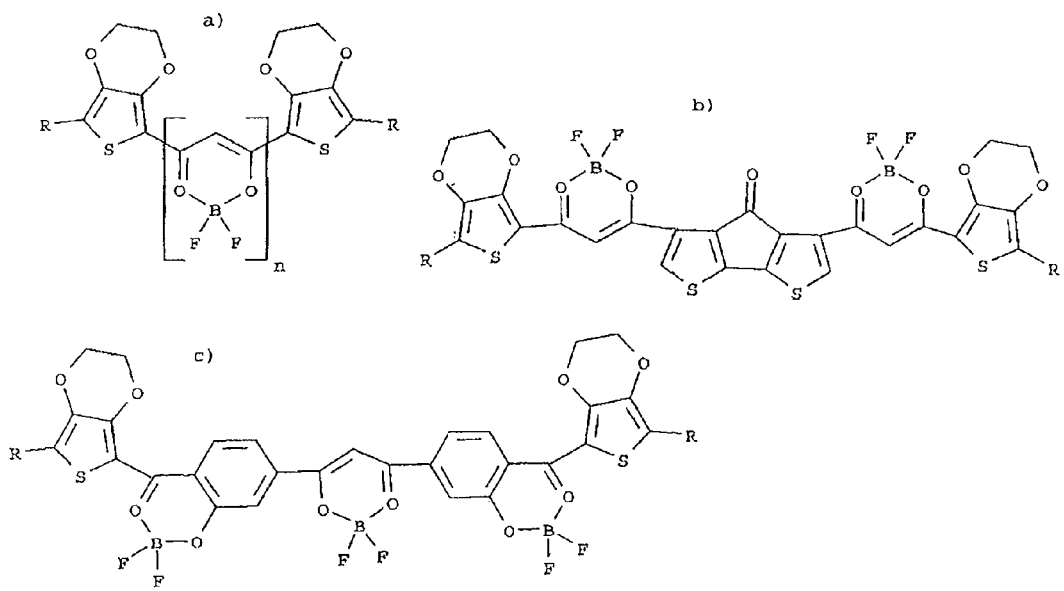
FIG. 10 shows examples for conjugated D-A-D oligomers with extended acceptor block.

FIG. 10 shows examples for D-A-D-BCO structures with an extended acceptor block. Instead of the EDOT group shown, that has an especially strong donor character, other donor units, e.g., the donor units shown in FIG. 6, can also be used. Also, all units from FIG. 7 and FIG. 8 can be used as acceptor monomer.

Figure 11:
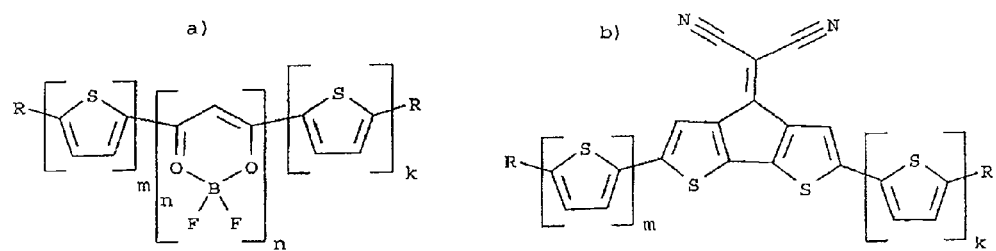
FIG. 11 shows examples for conjugated D-A-D/D-A-D' oligomers with extended donor blocks at both ends.

FIG. 11 shows examples for D-A-D'-BCO structures with extended donor blocks on both ends. The peripheral hydrogen atoms can be substituted entirely or partially by any groups, but preferably by halogen, nitrile, alkyl, alkoxy or aryl groups. Even other donor blocks, e.g., any combinations of the units shown in FIG. 6, can be used. Likewise, all units from FIG. 7 and FIG. 8 can be used as acceptor monomer.

Figure 12:
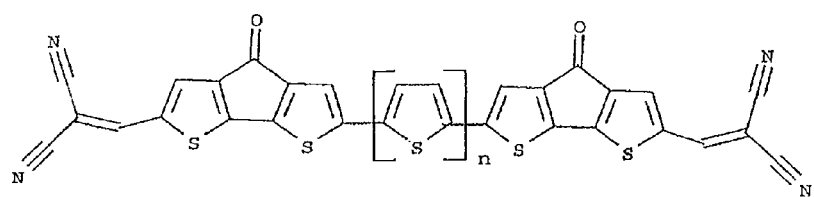
FIG. 12 shows examples for conjugated A-D-A'/A-D-A oligomers with extended acceptor blocks at both ends.
Figure 12:
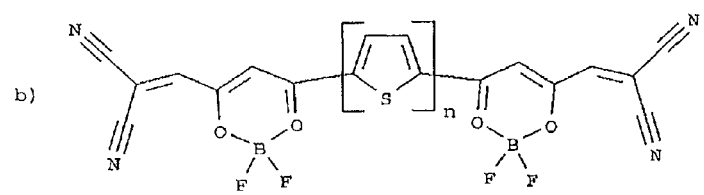
Figure 12:
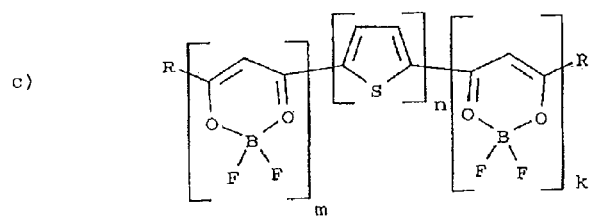

FIG. 12 shows examples for A-D-A'-BCO structures with extended acceptor blocks on both ends, in which n>0, m>1, k>1. The peripheral hydrogen atoms can be substituted entirely or partially by halogen, nitrile, alkoxy or aryl groups. Other donor units, e.g., any combinations of the units shown in FIG. 6, can also be used. Likewise, any combinations of the units from FIG. 7 and FIG. 8 can be used as acceptor block. R designates any group, preferably a hydrogen or halogen, nitrile, alkyl, alkoxy or aryl group.

Figure 13:
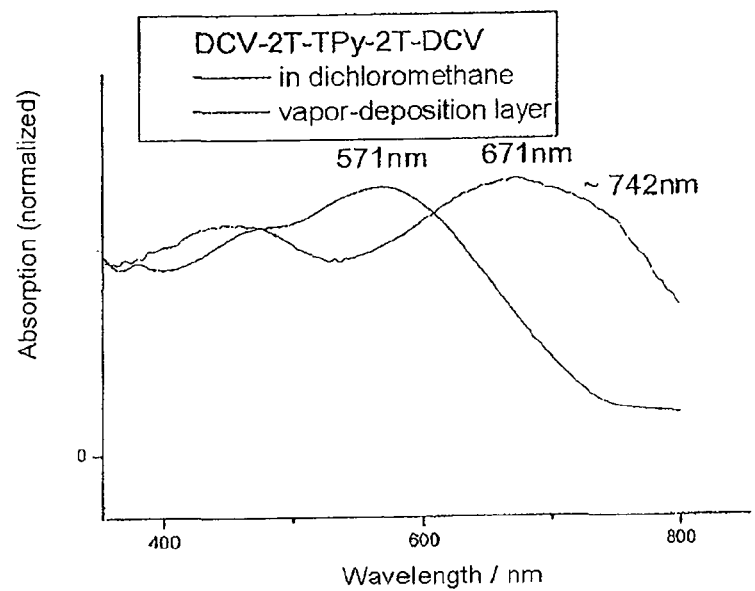
FIG. 13 shows an absorption spectrum in dichloromethane solution and for a vapor-deposition layer of DCV-2T-TPy-2T-DCV.
Figure 13:
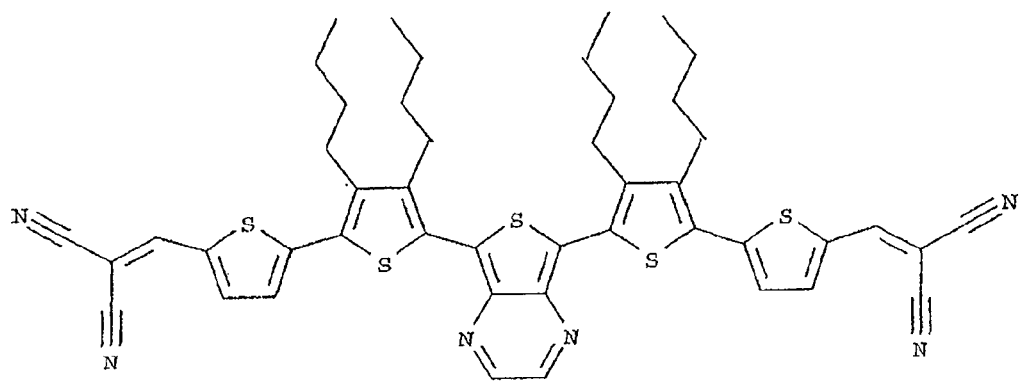

FIG. 13 shows absorption spectra in dichloromethane solution and for a vapor-deposition layer of DCV-2T-TPy-DCV, a derivative of DCV5T with a thienopyrazine group in the donor block, as well as the structural formula of DCV-2T-TPy-2T-DCV.

Preferred embodiments for photoactive organic devices with a structural buildup according to FIG. 1 on the basis of A-D-A'-BCO are described in the following.

Example 1

In a first example DCV3T (cf. structure in FIG. 5 with n=1 and group R1=hydrogen atom) is used as acceptor molecule in a heterojunction with N,N,N',N'-tetrakis(4-methoxyphenyl) benzidine (MeOTPD) as donor molecule. A possible layer sequence for such a heterojunction, inserted into an M-i-p structure, is: Glass substrate/ITO/$C_{60}$ (optional as electron transport layer)/DCV3T/MeOTPD/p-doped MeOTPD/p-doped zinc phthalocyanine (ZnPc; optional for improving the ohmic contact)/gold.

Since MeOTPD is largely transparent and the interface between $C_{60}$ and DCV3T is not suitable for exciton separation, the generation of photocurrent results here exclusively from the light absorption in DCV3T and the subsequent exciton separation on the interface between DCV3T and MeOTPD.

Figure 14:
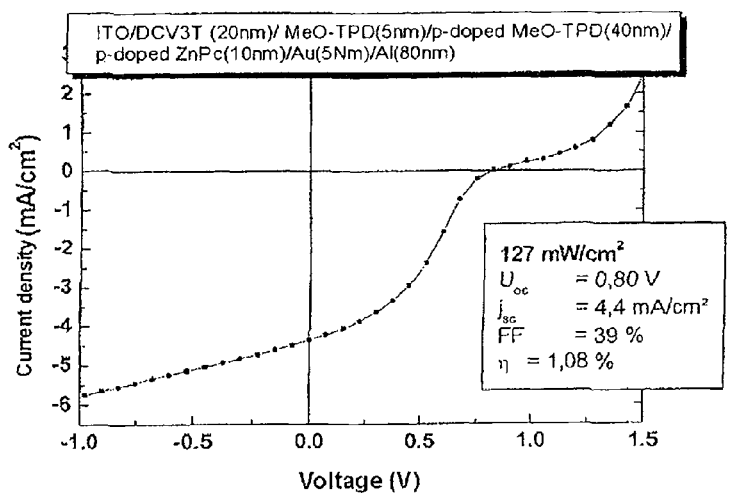
FIG. 14 shows a current-voltage characteristics with illumination for a solar cell with a 20 nm-thick DCV3T layer and a 5 nm-thick MeO-TPD layer.

FIG. 14 shows a current-voltage characteristics with illumination for a solar cell with a 20 nm-thick DCV3T layer and a 5 nm-thick layer of pure MeOTPD that make the exciton-separating interface available. The precise layer sequence and the characteristic data of the illuminated solar cell are also indicated in FIG. 14. The S-shape of the characteristics around the value of +1V is connected to the inefficient electron injection from ITO into DCV3T. The problem can be overcome by inserting an n-doped intermediate layer with a suitable position of the Fermi level.

Example 2

In a second example the transparent MeOTPD in example 1 is replaced at the top by a layer of ZnPc, so that the layer sequence is: Glass substrate/ITO/$C_{60}$ (optional as electron transport layer)/DCV3T/ZnPc/p-doped MeOTPD/p-doped ZnPc (optional for improving the ohmic contact)/gold.

Figure 15:
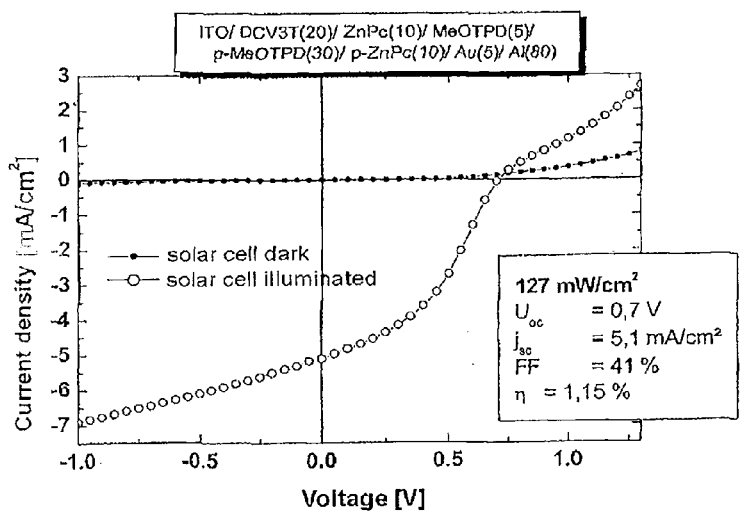
FIG. 15 shows a current-voltage characteristics with and without illumination for a solar cell with a 20 nm-thick DCV3T layer and a 10 nm-thick ZnPc layer.

FIG. 15 shows a current-voltage characteristics with and without illumination for a solar cell with a 20 nm-thick DCV3T layer and a 10 nm-thick ZnPc layer. These layers form the separating interface for excitons. The precise layer sequence and the characteristic parameters of the illuminated solar cell are also indicated in FIG. 14.

The functional principle corresponds to that in example 1 above. In addition, a generation of photocurrent takes place by light absorption on ZnPc and exciton separation on the heterojunction to DCV3T. As a result, the short-circuit current ($j_{sc}$) is enlarged in comparison to example 1 above.

In examples 1 and 2 the A-D-A'-BCO DCV3T is therefore used as acceptor and electron-conducting material. The advantageous properties of A-D-A'-BCO as concerns stack behavior, absorption and exciton dynamics have an effect here already. However, this type of usage is not optimal since the electrons are heavily localized on the acceptor units so that A-D-A'-BCOs with short acceptor units are not good electron conductors. However, the electron mobility is not quite as critical for photoactive organic devices with a flat heterojunction and a thin absorption layer as in bulk heterojunctions in which small electron mobilities result immediately in high recombination losses. Attempts to produce solar cells with bulk heterojunction from DCV3T and, e.g., ZnPc or 4P-TPD accordingly showed low efficiencies below 0.5%.

The using of A-D-A'-BCOs with acceptor units of only one monomer in bulk heterojunctions is not purposeful. D-A-D'-BCOs with a very short acceptor block (m<3) is likewise not very purposeful and their use as electron conductors in bulk heterojunctions is also not appropriate since they do not have any sufficiently delocalized electron wave function.

Example 3

In a third example the DCV3T from example 1 is replaced by DCV5T (cf. structure in (FIG. 5) with n=2 and R1=hydrogen) for further increasing the light absorption in the red spectral range so that the following layer sequence results: Glass substrate/ITO/$C_{60}$/DCV5T/MeOTPD/p-doped MeOTPD/p-doped ZnPc (optional for improving the ohmic contact)/gold.

It was found that in the third example, in contrast to examples 1 and 2, the photoactive interface occurs between DCV5T and $C_{60}$, the A-D-A'-BCO DCV5T acting, in contrast to DCV3T, as donor in the photoactive heterojunction and as hole conductor. The difference is explained by the lower ionization energy of the DCV5T molecule, which has the longer donor block.

Figure 16:
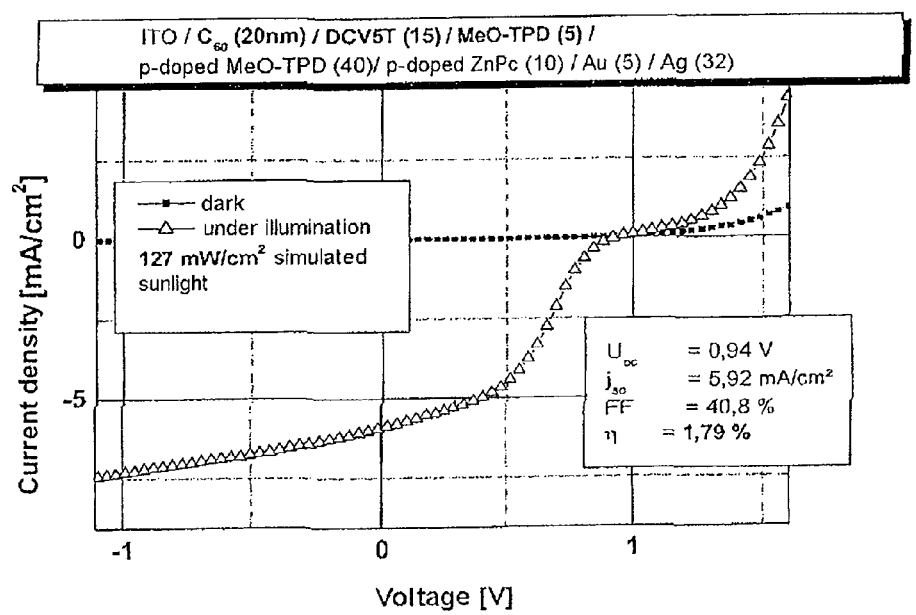
FIG. 16 shows a current-voltage characteristics with and without illumination for a solar cell with a 20 nm-thick $C_{60}$ layer and a 15 nm-thick DCV5T layer.

FIG. 16 shows a current-voltage characteristics with and without illumination for a solar cell with a 20 nm-thick $C_{60}$ layer and a 15 nm-thick DCV5T layer that act here as active materials. The layer sequence is indicated in the insert. The cell achieves an open circuit voltage of 0.94V, a short-circuit current density of approximately 6 mA/cm$^2$ and thus a power conversion efficiency of approximately 1.8%. An otherwise identical solar cell in which the 15 nm DCV5T was replaced by 15 nm dihexylquinquethiophene (DH5T), that is, a conventional donor oligomer, only achieves an open circuit voltage of approximately 0.34V, a short-circuit current density of approximately 3.1 mA/cm$^2$ and thus a power conversion efficiency of approximately 0.4%, with the photocurrent being traceable almost exclusively to absorption by $C_{60}$.

Figure 17:
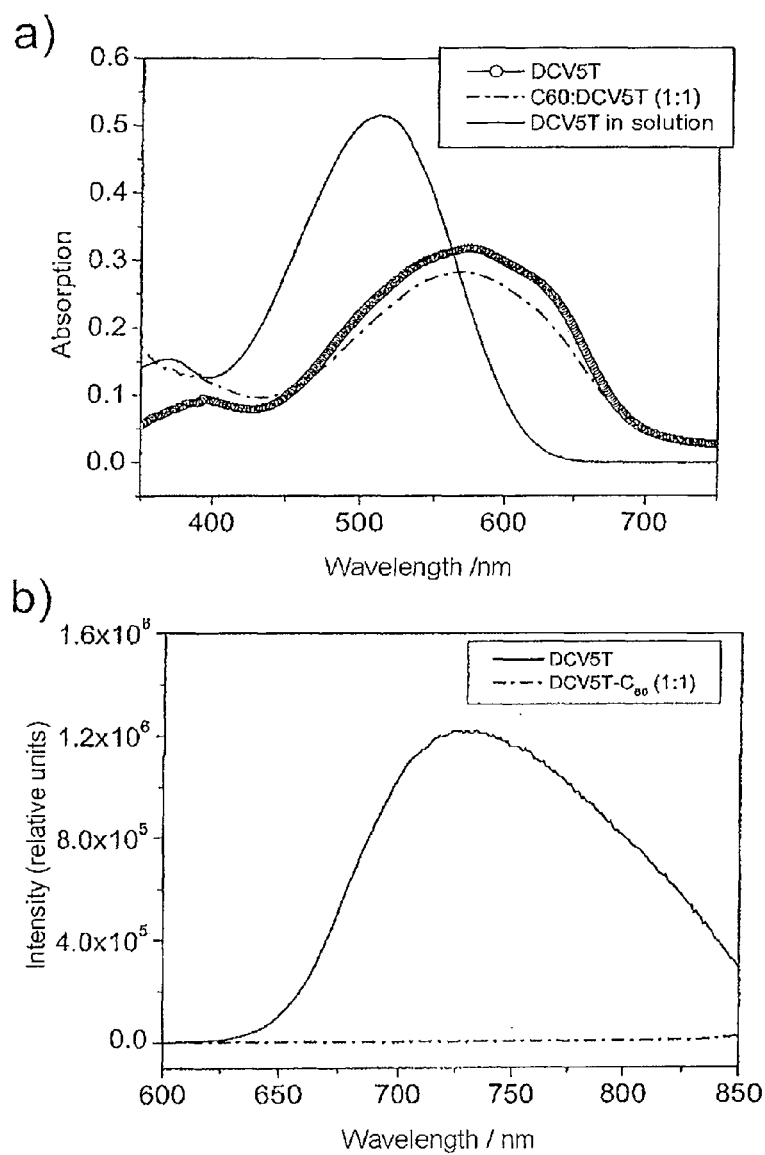
FIG. 17 shows an absorption spectrum of DCV5T (a)) as well as a fluorescence spectrum of DCV5T (b))

FIG. 17 shows a) absorption spectra of DCV5T as a pure vapor-deposition layer, as mixed layer with $C_{60}$ (1:1) and dissolved in $CH_2Cl_2$. The shift of the absorption peak during the transition of DCV5T from the liquid into the solid phase is unambiguously visible. FIG. 17 furthermore shows b) a fluorescence spectrum of pure DCV5T and a mixed layer consisting of DCV5T and $C_{60}$ (1:1). It can be recognized in the spectrum of the mixed layer that the fluorescence of DCV5T is extinguished by the $C_{60}$.

Figure 18:
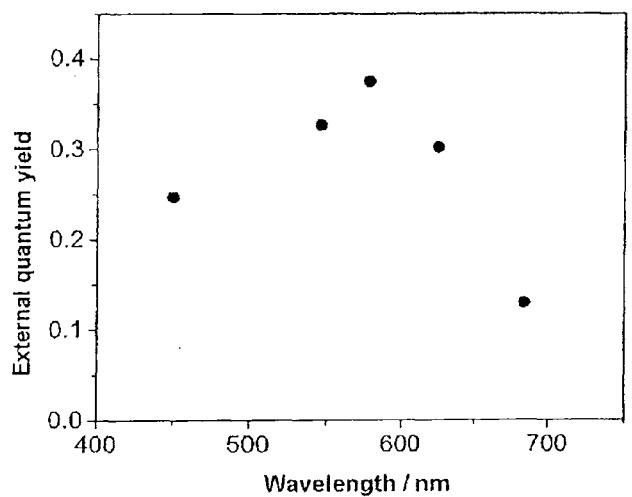
FIG. 18 shows an external quantum yield for the solar cell measured in FIG. 16.

FIG. 18 shows an external quantum yield of the solar cell measured in FIG. 16. It can be recognized that the absorption of DCV5T contributes proportionately the most to the current of the solar cell (see quantum yields at 550-600 nm).

Example 4

In a fourth example the ionization energy drops further for longer oligothiophene units (e.g., DCV6T, structure in FIG. 5 with D1=D3=thiophene, D2=dibutylthiophene and R1=hydrogen or selectively with electron-shifting group R—e.g., alkyl or alkoxy group—for ensuring a sufficiently low electron affinity), so that even these A-D-A'-BCOs can be used as donor molecule in combination with $C_{60}$ as acceptor molecule. An exemplary layer sequence for such a heterojunction inserted into an m-i-p structure is: Glass substrate/ITO/$C_{60}$/DCV6T/p-doped MeOTPD/p-doped ZnPc (optional for improving the ohmic contact)/gold.

Figure 19:
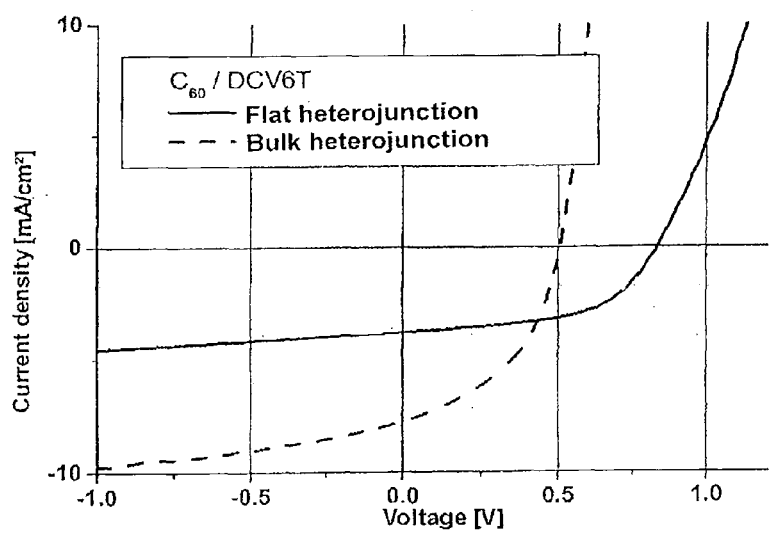
FIG. 19 shows a current-voltage characteristics under illumination for a solar cell based on a photoactive heterojunction between $C_{60}$ and DCV6T.

FIG. 19 shows a current-voltage characteristics under illumination with 127 mW/cm$^2$ simulated sunlight for solar cells based on a photoactive heterojunction between $C_{60}$ and DCV6T, carried out as a flat heterojunction (solid line) or bulk heterojunction (dashed line—cf. example 5 below).

Example 5

In a fifth example a mixed layer of $C_{60}$ and DCV6T is used as a bulk heterojunction in the structure of example 4 instead of the flat heterojunction for enlarging the active interface. The following layer sequence results: Glass substrate/ITO/$C_{60}$*DCV6T (volumetric ratio between 4:1 and 1:1)/p-doped MeOTPD/p-doped ZnPc (optional for improving the ohmic contact)/gold.

Example 6

All above-cited active layer systems can also be inserted into structures without doped layers instead of into M-i-p cells. An advantageous realization of this is the following structure using the active system of example 4: Glass substrate/ITO/3,4-polyethylenedioxythiophene:polystyrene sulfonate (PEDOT:PSS; optional as polymeric hole-conducting layer)/DCV6T/$C_{60}$/optional for improving the contact; e.g., bathocuproin, bathophenantroline or LiF/aluminum.

Figure 20:
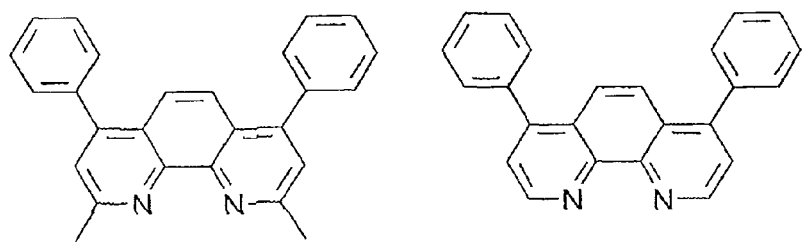
FIG. 20 shows the chemical structure of bathocuproin and bathophenatroline.

FIG. 20 shows the chemical structure of bathocuproin and bathophenantroline.

Example 7

According to a seventh example a p-i-n structure is provided. For example, the following layer built up was selected: Glass substrate/ITO/p-doped MeOTPD/$C_{60}$*DCV6T (volumetric ratio between 4:1 and 1:1)/n-doped $C_{60}$/aluminum. In alternate embodiments, it was surprisingly found that a volumetric ratio between 1:1 and 1:4 is advantageous.

Example 8

An eighth example concerns an advantageous variant of example 3. In it the photoactive heterojunction between $C_{60}$ and DCV5T is inserted into the following p-i-I structure: Glass substrate/ITO/p-doped HTL/non-doped HTL/DCV5T/$C_{60}$/BPhen/Al, wherein HTL designates a hole transport material with a large band gap such as MeO-TPD or Di-NPB here.

Figure 21:
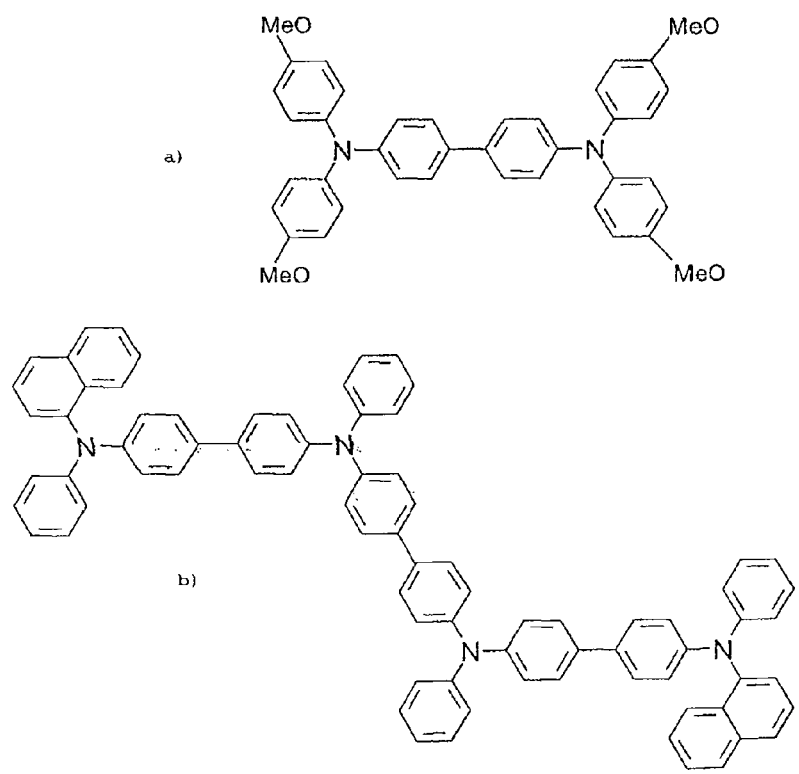
FIG. 21 shows the chemical structure of MeO-TPD and Di-NPB.

FIG. 21 shows the chemical structure of MeO-TPD (above) and Di-NPB (below).

Figure 22:
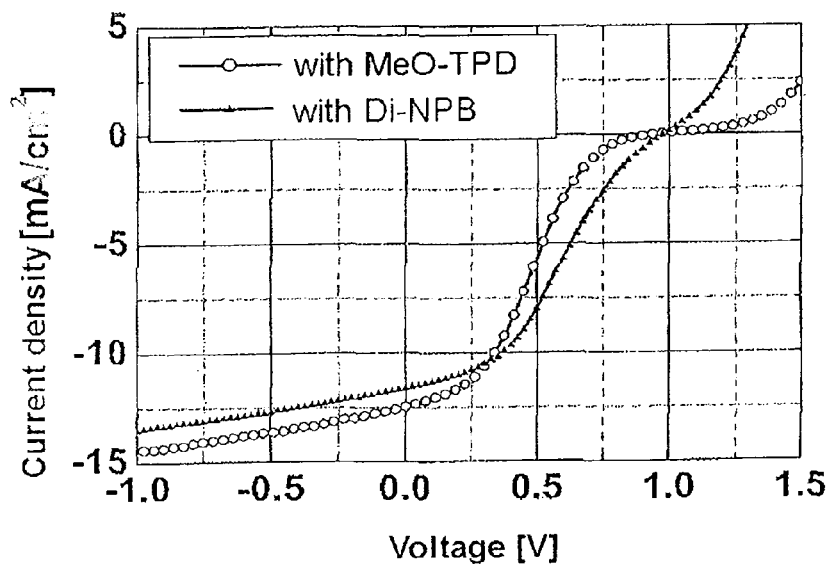
FIG. 22 shows a current-voltage characteristics under illumination for a solar cell according to example 8.

FIG. 22 shows a current-voltage characteristics under illumination with 127 mW/cm$^2$ simulated sunlight for solar cells according to example 8 based on a photoactive heterojunction between $C_{60}$ and DCV5T in a p-i-i structure with MeO-TPD or Di-NPB (cf. FIG. 21) as hole transport material. The solar cell with Di-NPB achieves an energetic degree of efficiency of approximately 3% for simulated sunlight.

Figure 23:
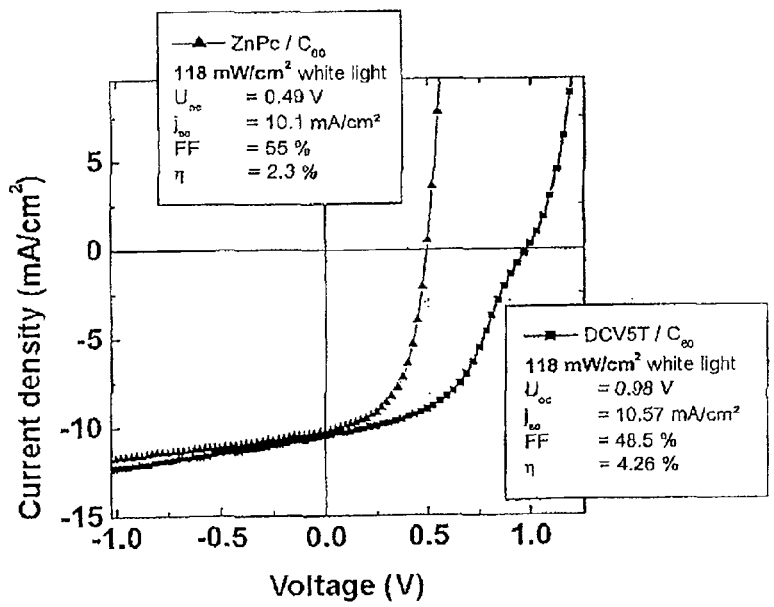
FIG. 23 shows a comparison of an optimized solar cell according to example 3 with photoactive heterojunction between DCV5T and $C_{60}$ with p-doped DiNPD as hole transporter (rectangles) with an analogous structure based on a photoactive heterojunction of zinc phthalocyanin (ZnPc) and $C_{60}$ (rectangles).

FIG. 23 shows a comparison of an optimized solar cell according to example 3 with photoactive heterojunction between DCV5T and $C_{60}$ with p-doped DiNPD as a hole transporter (rectangles) with an analogy structure based on a photoactive heterojunction of zinc phthalocyanine (ZnPc) and $C_{60}$ (rectangles). The DCV5T displays with approximately 4.3% almost the double degree of efficiency although a 10 nm-thick mixed layer of ZnPc and $C_{60}$ is inserted in the ZnPc/$C_{60}$ solar cell in order to increase the photocurrent. Without this addition the photocurrent drops in the ZnPc/$C_{60}$ cell to approximately 6 mA/cm$^2$.

Example 9

In a ninth example flat heterojunctions and bulk heterojunctions are combined in order to raise the photocurrent and, e.g., the following structure is formed: Glass substrate/ITO/p-doped MeOTPD/DCV6T/DCV6T*$C_{60}$ (volumetric ratio between 4:1 and 1:1)/$C_{60}$/n-doped $C_{60}$/aluminum.

Here, e.g., excitons that are excited in the pure DCV6T layer, can diffuse to the neighboring mixed layer where they are separated into pairs of free charge carriers when they meet $C_{60}$ molecules. A corresponding situation applies to excitons generated in the pure $C_{60}$ layer.

In a combined heterojunction as in example 8 even different materials can be combined for further broadening the excitation spectrum: Glass substrate/ITO/p-doped MeOTPD/EDOT-DCV5T/$C_{60}$*DCV6T (volumetric ratio between 4:1 and 1:1)/TCV3T/n-doped $C_{60}$/aluminum.

Figure 2:
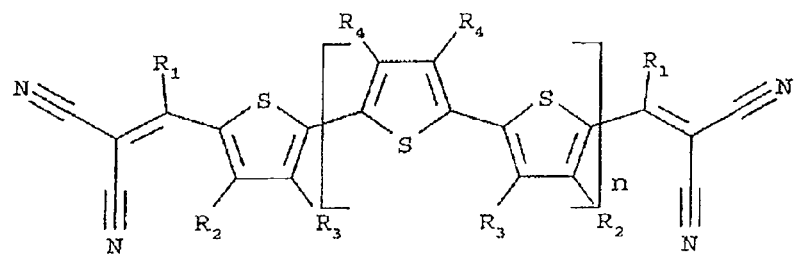
FIG. 2 shows the chemical structure of bis(dicyanovinylene) oligothiophene derivatives: Example for chemical structure of bis(dicyanovinylene) oligothiophene derivatives, in which $n \geq 1$ and R1-R4 are any groups, preferably a hydrogen atom or halogen groups, nitrile groups, alkyl groups, alkoxy groups or aryl groups.

The pure layers of EDOT-DCV5T (derivative of DCV5T, with at least one thiophene ring in the donor block being replaced by the EDOT group (FIG. 6d with Y1=Y2=O and R1=R2=H), or TCV3T (cf. structure in FIG. 2 with n=1 and R1=CN)), are selected in such a manner here that a hole transfer from the mixed layer onto EDOT-DCV5T and an electron transfer from the mixed layer onto TCV3T is made possible in a barrier-free manner.

The features of the invention disclosed in the previous description, the claims and the drawings can be significant individually as well as in any combination for the realization of the invention in its various embodiments.

The invention claimed is:
1. An organic photoactive device, with a contact and a countercontact as well as with an organic region that is electrically connected to the contact and the countercontact, wherein a photoactive region with a photoactive bulk heterojunction between an electron-conducting organic material and a hole-conducting organic material is formed in the organic region and wherein the hole-conducting organic material is formed from oligomers according to any one of the following types:
conjugated acceptor-donor-acceptor oligomer (A-D-A' oligomer) with an acceptor unit (A) and a further acceptor unit (A') that are each connected to a donor unit (D), wherein the donor unit (D) is formed as an extended donor block; and
conjugated donor-acceptor-donor oligomer (D-A-D' oligomer) with a donor unit (D) and a further donor unit (D') that are each connected to an acceptor unit (A), wherein the donor unit (D) and the further donor unit (D') is formed as an extended donor block.

2. An organic photoactive device, with a contact and a countercontact as well as with an organic region that is electrically connected to the contact and the countercontact, wherein a photoactive region with a photoactive bulk heterojunction between an electron-conducting organic material and a hole-conducting organic material is formed in the organic region and wherein the electron-conducting organic material is formed from oligomers according to any one of the following types:

conjugated acceptor-donor-acceptor oligomer (A-D-A' oligomer) with an acceptor unit (A) and a further acceptor unit (A') that are each connected to a donor unit (D), wherein the acceptor unit (A) and the further acceptor unit (A') is formed as an extended acceptor block; and conjugated donor-acceptor-donor oligomer (D-A-D' oligomer) with a donor unit (D) and a further donor unit (D') that are each connected to an acceptor unit (A), wherein the acceptor unit (A) is formed as an extended acceptor block.

3. An organic photoactive device, with a contact and a countercontact as well as with an organic region that is electrically connected to the contact and the countercontact, wherein a photoactive region with a photoactive flat heterojunction between an electron-conducting organic material and a hole-conducting organic material is formed in the organic region and wherein the electron-conducting material and/or the hole-conducting organic material is/are formed from oligomers according to any one of the following types:

conjugated acceptor-donor-acceptor oligomer (A-D-A' oligomer) with an acceptor unit (A) and a further acceptor unit (A') that are each connected to a donor unit (D), wherein either at least the donor unit (D) is formed as an extended donor block or at least the acceptor unit (A) and the further acceptor unit (A') are formed as an extended acceptor block; and conjugated donor-acceptor-donor oligomer (D-A-D' oligomer) with a donor unit (D) and a further donor unit (D') that are connected to an acceptor unit (A), wherein either at least the acceptor unit (A) acceptor unit (A) is formed as an extended acceptor block or the donor unit (D) and the further donor unit (D') are formed as an extended donor block.

4. The device according to claim 1, wherein in the conjugated acceptor-donor-acceptor oligomer (A-D-A' oligomer) the acceptor unit (A) and the further acceptor unit (A') are formed from monomers of the same type.

5. The device according to claim 1, wherein in the conjugated donor-acceptor-donor oligomer (D-A-D' oligomer) the donor unit (D) and the further donor unit (D') are formed from monomers of the same type.

6. The device according to claim 4, wherein in the conjugated acceptor-donor-acceptor oligomer (A-D-A' oligomer) the donor unit (D) has a monomer sequence of the type $D_1 D_2 \ldots D_{m-1} D_m$ (m>2), wherein a highest occupied molecular orbital (HOMO) of the monomers $D_1$ and $D_m$ is at least 0.2 eV energetically higher than a highest occupied molecular orbital (HOMO) of the other monomers $D_2 \ldots D_{m-1}$.

7. The device according to claim 4, wherein in the conjugated donor-acceptor-donor oligomer (D-A-D' oligomer) the acceptor unit (A) has a monomer sequence of the type $A_1 A_2 \ldots A_{m-1} A_m$ (m>2), wherein a lowest unoccupied molecular orbital (LUMO) of the monomers $A_1$ and $A_m$ is at least 0.2 eV energetically lower than a lowest unoccupied molecular orbital (LUMO) of the other monomers $A_2 \ldots A_{m-1}$.

8. The device according to claim 1, wherein a mirror symmetry or point symmetry is formed in the conjugated acceptor-donor-acceptor oligomer (A-D-A' oligomer).

9. The device according to claim 1, wherein a mirror symmetry or point symmetry is formed in the conjugated donor-acceptor-donor oligomer (D-A-D' oligomer).

10. The device according to claim 1, wherein at least one of the contact and the countercontact is/are designed as a transparent or semi-transparent electrode.

11. The device according to claim 1, further comprising at least one inorganic layer of one or more inorganic materials formed between the contact and the countercontact.

12. The device according to claim 1, wherein at least one of the conjugated acceptor-donor-acceptor oligomer (A-D-A' oligomer) and the donor-acceptor-donor oligomer (D-A-D' oligomer) is/are formed as an oligomer that has nitrile groups on at least one acceptor unit (A; A') and in which at least one donor unit (D; D') has peripheral hydrogen atoms.

13. The device according to claim 1, wherein the contact is an anode and a p-doped organic layer is arranged between the anode and the photoactive heterojunction.

14. The device according to claim 1, wherein the countercontact is a cathode and an n-doped organic layer is arranged between the cathode and the photoactive heterojunction.

15. The device according to claim 1, wherein the organic region has been deposited at least partially by thermal vaporizing in a high vacuum or the vaporizing of organic materials into an inert carrier gas that transports the vaporized organic materials to a substrate ("organic vapor phase deposition").

16. The device according to claim 1, wherein the organic region has been deposited at least partially from one or several liquid solutions by spin-coating, application with a doctor blade and/or pressing.

17. The device according to claim 1, wherein at least one of the donor unit (D) and the further donor unit (D') contains/contain at least one of the following donor-like monomers with or without additional peripheral substituents:
a) thiophene
b) thienopyrazine
c) benzothiadiazole
d) ethylene dioxothiophene or ethylene dithiothiophene
e) isothianaphthene
f) bridged dithiophene unit
g) 1,3 thiazole
h) 1,3,4-thiadiazole
I) thieno-thiadiazole
j) thieno-selenodiazole
k) phenyl
l) naphthyl
m) anthrazene
n) tetrazene
o) pentazene-vinylene
q) phenylene vinylene
r) pyridines
s) pyrimidines
t) porphrine
u) phthalocyanines
v) fluorene
w) carbazole
x) perylene
y) pyrene
z) di- or triarylamine.

18. The device according to claim 4, wherein the acceptor unit (A) and/or the further acceptor unit (A') contains/contain at least one of the following acceptor-like monomers with or without additional peripheral substituents:
  a) cyano-, bicyano or tricyano vinylene
  b) bridged dithiophene unit with electron-attracting bridge
  c) benzothiadiazole
  d) oxadiazole
  e) triazole
  f) benzimidazole
  g) quinolines
  h) quinoxalines
  I) pyrazolines
  j) naphthanene dicarboxylic acid anhydrides
  k) naphthalene dicarboxylic acid imides
  l) naphthalene dicarboxylic acid imidazoles
  m) halogenated homocycles and heterocycles
  n) di- or triarylboryl
  o) dioxaborine derivatives (cf, in particular FIG. 7)
  p) quinoid structures
  q) aryls with ketone- or dicyanomethane substituents.

19. A device with a stacked arrangement of several stacked organic photoactive devices, according to claim 1.

* * * * *

UNITED STATES PATENT AND TRADEMARK OFFICE
CERTIFICATE OF CORRECTION

PATENT NO. : 8,426,727 B2  
APPLICATION NO. : 11/817626  
DATED : April 23, 2013  
INVENTOR(S) : Pfeiffer et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1602 days.

Signed and Sealed this
Eighth Day of September, 2015

Michelle K. Lee
*Director of the United States Patent and Trademark Office*